(12) United States Patent
Deckert et al.

(10) Patent No.: US 12,375,188 B2
(45) Date of Patent: Jul. 29, 2025

(54) COMBINING SIGNALS TRANSMITTED FROM MULTIPLE PROBE ANTENNAS IN OVER-THE-AIR ANTENNA MEASUREMENTS

(71) Applicant: NATIONAL INSTRUMENTS CORPORATION, Austin, TX (US)

(72) Inventors: Thomas Deckert, Dresden (DE); Martin Obermaier, Dresden (DE); Dirk Plettemeier, Dresden (DE)

(73) Assignee: National Instruments Corporation, Austin, TX (US)

( * ) Notice: Subject to any disclaimer, the term of this patent is extended or adjusted under 35 U.S.C. 154(b) by 265 days.

(21) Appl. No.: 18/311,335

(22) Filed: May 3, 2023

(65) Prior Publication Data
US 2024/0372633 A1 Nov. 7, 2024

(51) Int. Cl.
*H04B 17/00* (2015.01)
*G01R 29/08* (2006.01)
*H04B 17/16* (2015.01)

(52) U.S. Cl.
CPC ..... *H04B 17/0085* (2013.01); *G01R 29/0814* (2013.01); *H04B 17/16* (2015.01)

(58) Field of Classification Search
CPC .... H04B 17/0085; H04B 17/16; H04B 17/12; H04B 7/0671; H04B 7/04; H04B 17/29; H04B 17/102; G01R 29/0814; G01R 29/10; G01R 31/2822; G01R 29/105; H04W 24/06; H04L 5/14; H01Q 3/267; H01Q 21/061
See application file for complete search history.

(56) References Cited

U.S. PATENT DOCUMENTS 10,942,214 B2   3/2021   Orozco Valdes et al.
11,515,950 B2   11/2022  Laabs et al.
(Continued)

OTHER PUBLICATIONS

H. G. Booker and P. C. Clemmow, "The Concept of an Angular Spectrum of Plane Waves, and its Relation to that of Polar Diagram and Aperture Distribution," Proc. IEE (London), vol. 97, part III, pp. 11-17, Jan. 1950.

(Continued)

*Primary Examiner* — Renan Luque
(74) *Attorney, Agent, or Firm* — Kowert, Hood, Munyon, Rankin & Goetzel, P.C.; Jeffrey C. Hood; Luke Langsjoen

(57) ABSTRACT

A system and method for testing an antenna-under-test (AUT). A multi-probe antenna array transmitter is moved to a plurality of positions within a scan area. At each position, each probe antenna element of the transmitter transmits a near-field (NF) over-the-air (OTA) signal to the AUT. An alignment procedure is performed to align transmission locations for signals transmitted by different ones of the plurality of probe antenna elements. Correction factors are determined that characterize amplitude and phase discrepancies between the probe antenna elements of the transmitter. The correction factors are applied to the signals, and the corrected signals are combined at each transmission location to obtain average signals. A far-field (FF) reception pattern for the AUT is determined based on a discrete Fourier transform of the average signals and stored in a non-transitory computer readable memory medium.

20 Claims, 15 Drawing Sheets

(56) References Cited

U.S. PATENT DOCUMENTS

| | | | |
|---|---|---|---|
| 2015/0124634 A1* | 5/2015 | Harel | H04W 24/08 |
| | | | 370/278 |
| 2018/0034566 A1* | 2/2018 | Tankielun | H04B 17/12 |
| 2019/0235003 A1* | 8/2019 | Paulsen | H01Q 3/267 |
| 2019/0348760 A1* | 11/2019 | Lee | G01R 29/105 |

OTHER PUBLICATIONS

G. F. Masters, "Probe-Correction Coefficients Derived from Near-field Measurements," Antenna Measurements Techniques Association Conference, 1991, 10 pgs.

C. A. Balanis, "Antenna Theory: Analysis and Design", Wiley, 2005, 1072 pgs.

C. A. Balanis (ed.), "Modern Antenna Handbook", Wiley, 2008, 30 pgs.

D. Paris, W. Leach and E. Joy, "Basic theory of probe-compensated near-field measurements," in IEEE Transactions on Antennas and Propagation, vol. 26, No. 3, pp. 373-379, May 1978.

\* cited by examiner

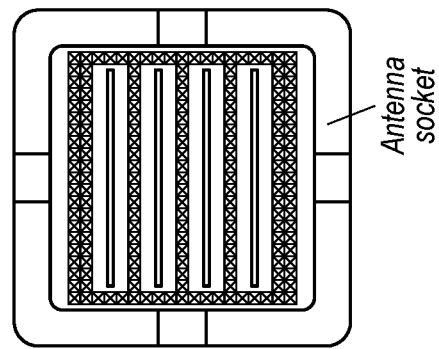
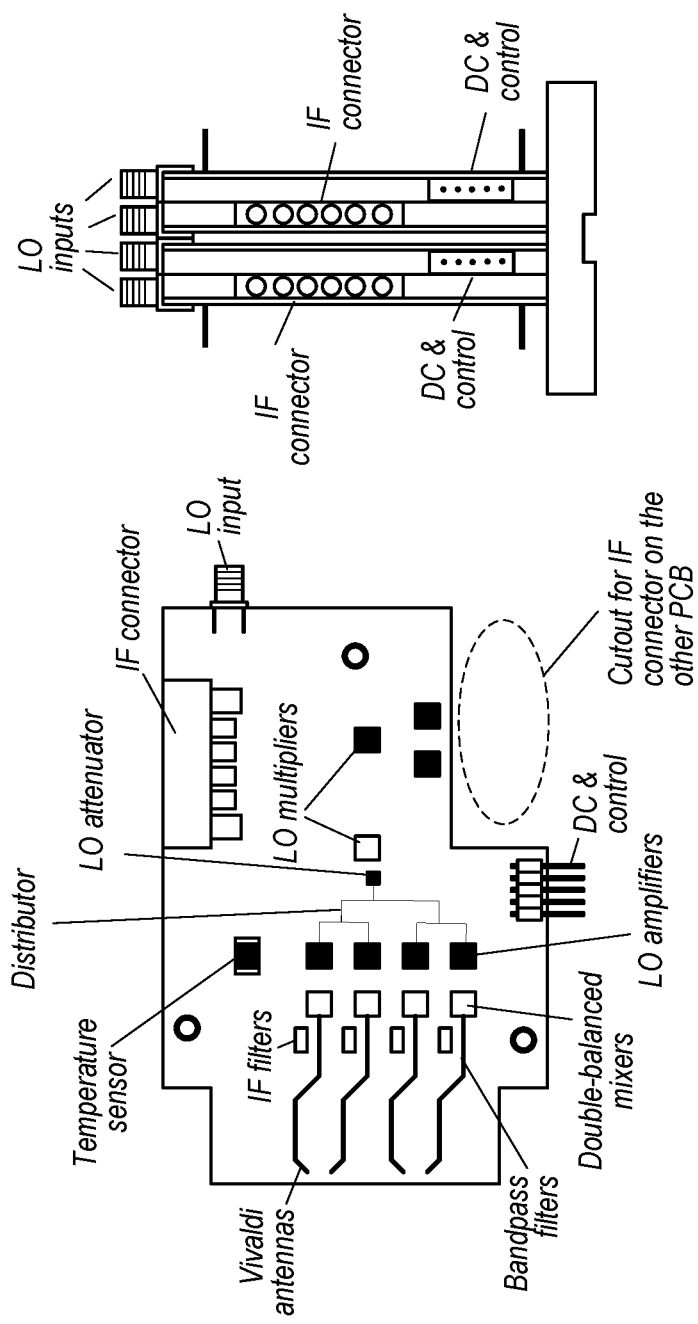
FIG. 9C
FIG. 9B
FIG. 9A

Antenna co-pol azimuth cut

Antenna co-pol elevation cut

Antenna cross-pol azimuth cut

Antenna cross-pol elevation cut

COMBINING SIGNALS TRANSMITTED FROM MULTIPLE PROBE ANTENNAS IN OVER-THE-AIR ANTENNA MEASUREMENTS

FIELD OF THE INVENTION

The present invention relates to the field of semiconductor testing, and more specifically, to testing of millimeter wave integrated circuits with integrated antennas operating in transmit or receive mode.

DESCRIPTION OF THE RELATED ART

One key requirement for modern wireless communication technologies is the support of very high data rates. One option to enable higher data rates is to increase the system bandwidth on the order of 1-2 GHz. Contiguous wide bandwidth is in particular available at higher millimeter wave frequencies such as 24 GHz and above. To overcome the high pathloss at those frequencies, antenna array technology is used to steer the radiated energy to a specific direction.

Thus, as wireless technology (such as $5^{th}$ generation (5G) New Radio (NR), or other wireless technologies) has become more widespread, beamforming millimeter wave technology has rapidly grown in importance. Current user equipment devices, e.g., cell phones, use integrated circuits with integrated antenna arrays for transmitting and/or receiving millimeter wave signals. These antenna arrays are characterized and tested over-the-air (OTA) to determine if they satisfy various regulatory requirements.

In particular, smartphones with millimeter wave support are much more challenging to realize than infrastructure components such as base stations because one has to overcome the high blockage through hands etc. Therefore, multiple antenna-in-package (AiP) modules are needed per device. If one assumes 3-4 AiP modules per premium smartphone, one arrives at test volumes of >200 M AiP units per year.

Such antenna arrays are often characterized in anechoic chambers and with a distance R between the probe antenna and the device under test (DUT) to approximate far-field (FF) conditions for the propagation of the electromagnetic waves. One challenge with that testing approach is that the required FF distance R is physically large thus making the size of the anechoic chamber large in turn increasing the cost of testing. The minimum distance R for approximating FF conditions depends on the antenna aperture D and the wavelength λ as $$R=2D^2/\lambda$$

A bigger antenna aperture accordingly leads to a larger far-field distance. For distances less than the far-field distance, the electrical field may not be planar, and measurements may not represent accurately the far-field specifications in the regulatory requirements. Various small anechoic chambers and associated methods exist to reduce the size and cost of the test equipment while still creating FF conditions. However, the potential for such reduction in size and cost is limited.

Large test volumes may benefit from a completely new test approach. OTA testing using small chamber-based approaches would be prohibitively costly. A viable method should combine the capability to test a larger number of devices with the possibility to correlate test results to device validation measurements at a reasonable price.

Present methods for testing the antennas on these integrated circuits are slow, expensive, and/or suffer various drawbacks such that they are unable to economically test a sufficiently large number of antenna arrays. Improvements in the field, in particular, regarding the size, cost, and speed of a test system for automated production testing of modules and devices integrating active antenna arrays, are desired.

SUMMARY OF THE INVENTION

Various embodiments are presented below of a system and method for testing (e.g., rapidly and inexpensively) devices such as integrated circuits (IC) with integrated antennas configured for transmission and/or reception.

In some embodiments, a multi-probe antenna array transmitter is moved to a plurality of positions within a scan area. At each position, each probe antenna element of the transmitter transmits a near-field (NF) over-the-air (OTA) signal from the AUT.

In some embodiments, an alignment procedure is performed to align transmission locations for signals transmitted by different ones of the plurality of probe antenna elements.

In some embodiments, correction factors are determined that characterize amplitude and phase discrepancies between the probe antenna elements of the transmitter. The correction factors may be applied to the signals, and the corrected signals may be combined at each transmission location to obtain average signals.

In some embodiments, a far-field (FF) reception pattern for the AUT is determined based on a discrete Fourier transform of the average signals and stored in a non-transitory computer readable memory medium.

In some embodiments, a multi-probe antenna array receiver is moved to a plurality of positions within a scan area. At each position, each probe antenna element of the receiver receives a near-field (NF) over-the-air (OTA) signal from the AUT.

In some embodiments, an alignment procedure is performed to align reception locations for signals received by different ones of the plurality of probe antenna elements.

In some embodiments, correction factors are determined that characterize amplitude and phase discrepancies between the probe antenna elements of the receiver. The correction factors may be applied to the received signals, and the corrected signals may be combined at each reception location to obtain average signals.

In some embodiments, a far-field (FF) transmission pattern for the AUT is determined based on a discrete Fourier transform of the average signals and stored in a non-transitory computer readable memory medium.

Note that the techniques described herein may be implemented in and/or used with a number of different types of DUTs and/or AUTs, including but not limited to cellular phones, portable media players, tablet computers, wearable devices, RF semiconductor components, RF power amplifiers, Front End Modules, transceivers, and various other devices and wireless antennas.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which:

FIGS. 9A-C illustrate an example of a multi-probe receiver (for testing an AUT in transmit mode) or transmitter (for testing the AUT in receive mode), according to some embodiments;

Figure 1:
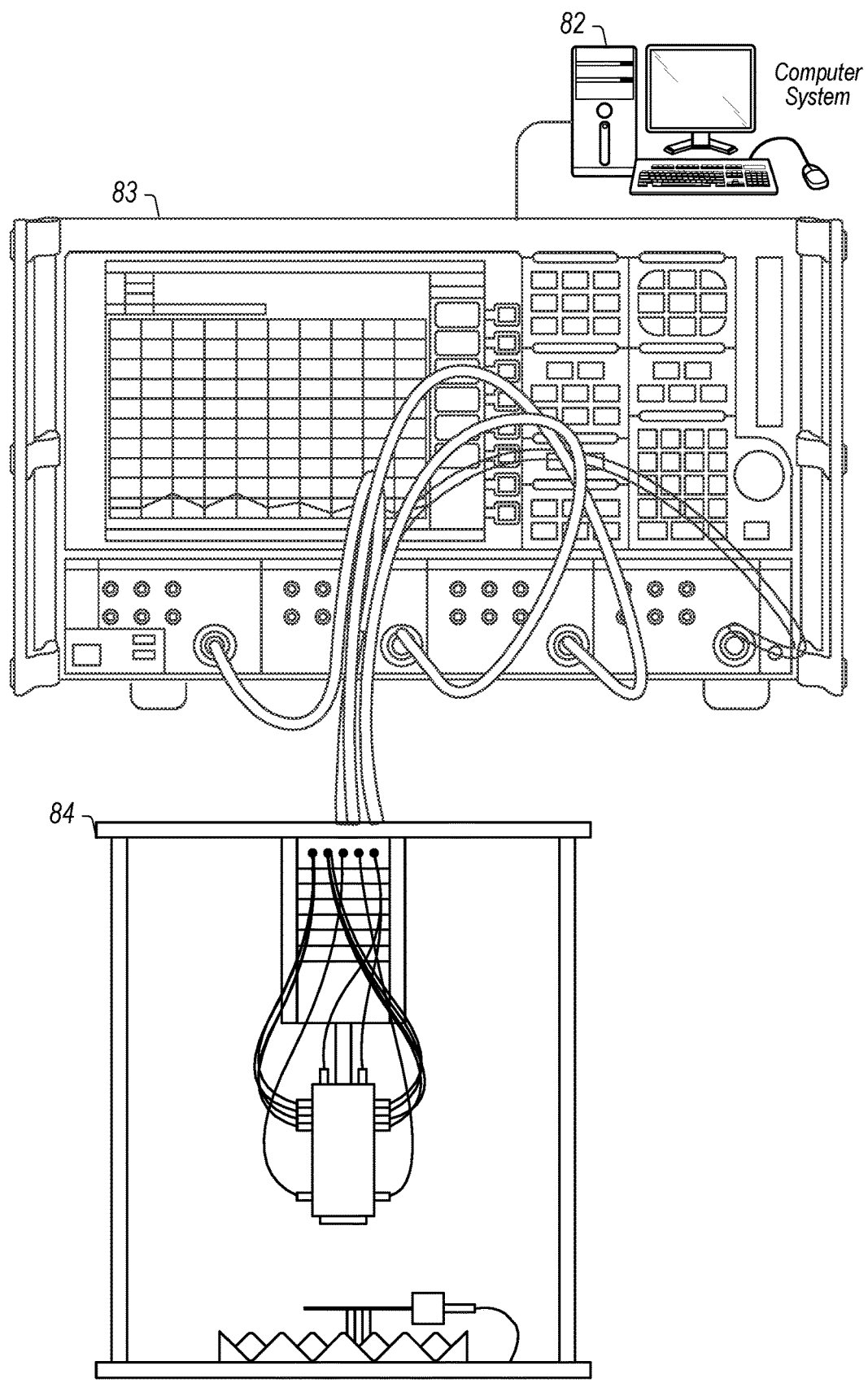
FIG. 1 illustrates an over the air (OTA) testing configuration, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Acronyms

The following is a listing of the acronyms used in the present application:
DUT: Device Under Test
AUT: Antenna Under Test
FF: Far-Field
IF: Intermediate Frequency
NF: Near-Field
OTA: Over-the-Air
PAS: Probe Antenna System
RF: Radio Frequency
PCB: Printed Circuit Board
LO: Local Oscillator

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

Far-Field (FF) pattern—a pattern of electromagnetic radiation that exists (or is presumed to exist) in a far field region around an object generating the electromagnetic radiation. An antenna, or a plurality of antenna elements, driven by a signal create electromagnetic fields. In general, the observed amplitude and phase of the electromagnetic fields varies with distance of the observer from the radiating object and with angular direction from the object to the observer. The FF pattern refers to the far field pattern of electromagnetic fields around the antenna (or the object containing the antenna), and references the fact that amplitude and phase of these fields observed at some distance from the radiating object and taken relative to a reference angular direction at the same distance will be independent of distance from the object. Likewise, if an antenna or a plurality of antenna elements is used to receive signals, they respond with varying signal amplitude and phase depending on the distribution of energy in the electromagnetic field around the antenna or plurality of antenna elements. In this case the FF pattern describes for each of a range of angular directions how large the response of the antenna or plurality of antenna elements is for a plane wave of electromagnetic radiation traveling towards the antenna or plurality of antenna elements from that direction and where the amplitude and phase observed at some distance from the radiating object and taken relative to a reference angular direction at the same distance will be independent of the distance from the object. The FF is a well-known electromagnetic concept.

Probe antenna system (PAS)—a plurality of antenna probes and potentially supporting parts modifying the collective properties of the antenna probes and parts are presenting to the electromagnetic radiation associated with wireless signals and giving structural integrity to their assembly, and which may be used to measure the wireless signals generated by the DUT or to generate a field of electromagnetic radiation used to measure characteristics of the DUT in receive mode.

Probe-based field measurement of wireless signals—a measurement made with an antenna probe which is part of the PAS. The measurement may comprise determining amplitude and phase of the wireless signals present at the antenna probe. A plurality of probe-based field measurements is the collection of the measurements of all antenna probes belonging to the PAS wherein all these measurements may be made for the same wireless signals present at the PAS. Here "same wireless signals" may refer to the case where the arrangement and configuration of the DUT, the measurement instrumentation, supporting equipment, and ambient environmental conditions are the same for the measurements made with all the antenna probes of the PAS. Different embodiments may choose to make these measurements in various ways and various order, e.g., may perform the measurements on all antenna probes simultaneously or in successive order. A series of a plurality of probe-based field measurements corresponds to multiple of the plurality of probe-based field measurements wherein each one may be made for different wireless signals present at the PAS.

DUT-based field measurement of wireless signals—a measurement made with an antenna or antenna array which is part of the DUT. The measurement may comprise determining amplitude and phase of the wireless signals present at the antenna/antenna array. The wireless signals may be generated by a PAS or another device while the DUT is in receive mode. Here "same wireless signals" may refer to the case where the arrangement and configuration of the PAS and/or DUT, the measurement instrumentation, supporting equipment, and ambient environmental conditions are the same for the measurements made with all the antennas of the DUT. Different embodiments may choose to make these measurements in various ways and various order, e.g., may perform the measurements on all antennas simultaneously or in successive order. A series of a plurality of DUT-based field measurements corresponds to multiple of the plurality of DUT-based field measurements wherein each one may be made for different wireless signals present at the DUT.

FIG. 1—OTA Testing System

FIG. 1 illustrates an over the air (OTA) testing system configured to implement embodiments of the techniques disclosed herein, according to some embodiments. Embodiments of a method for OTA testing (e.g., for production testing of integrated circuits) of an antenna-under-test (AUT) or device-under-test (DUT) are described below. The system and method for OTA testing may utilize a near-field-to-far-field (NF-to-FF) reconstruction technique as described herein.

Note that various embodiments of the techniques disclosed herein may be implemented in a variety of different ways. For example, the methods described herein may be performed by software executing on a computer system. However, while some embodiments are described in terms of one or more programs executing on a computer, these embodiments are exemplary only, and are not intended to limit the techniques to any particular implementation or platform. Thus, for example, in some embodiments, the techniques may be implemented on or by a functional unit (also referred to herein as a processing element), which may include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

As shown in FIG. 1, the OTA test system may include a computer system 82 which couples to a testing apparatus 84. In FIG. 1 the computer system is shown as being a stand-alone computer system separate from the measurement chassis 83. The measurement chassis may in turn be coupled to a testing apparatus 84. Alternatively, the computer may be implemented in the measurement chassis 83. For example, the computer may be implemented as a board or module inserted into a PXI (PCI eXtensions for Instrumentation) chassis form factor. Any of various types of computer system and/or chassis configuration may be used.

The testing apparatus 84 may comprise a structure designed to receive an AUT/DUT. The AUT/DUT may be an antenna array chip, e.g., a chip which comprises a plurality of antennas, each antenna for generating electromagnetic radiation. The AUT/DUT may also be a user equipment, such as a cell phone, or other chip or device that has one or more antennas. While any of a variety of types of AUTs or DUTs may be utilized for embodiments described herein, for simplicity the term AUT will be used henceforth to describe the device whose antenna performance is being tested and characterized. The testing apparatus may also include a multi-probe antenna receiver such as a probe antenna system (PAS) designed to be placed proximate to the AUT for measuring electromagnetic signals produced by and/or transmitting electromagnetic signals to one or more antennas of the AUT. These transmitted electromagnetic signals are preferably not far-field signal transmissions, and in some embodiments are near field (NF) transmissions. The computer system 82 may be coupled to provide one or more stimulus signals to the PAS and/or AUT to selectively cause the various antennas to produce electromagnetic radiation. The AUT may be configured to receive and measure the NF electromagnetic signals produced by the probe antennas of the PAS and may provide these measured NF electromagnetic signals to the computer system 82 for processing. The housing for the receiver and/or the AUT may include a movable positioner that can move the receiver and/or the AUT to a plurality of positions within a scan area.

In the embodiment shown in FIG. 1, for ease of illustration, only a subset of the antennas in the DUT in the testing apparatus 84 are shown as being connected to the measurement chassis (only a subset of the total number of wires between the testing apparatus 84 and the chassis 83 are shown). However, it is noted that in a typical system all of the antennas in the DUT of the testing apparatus 84 would be connected to the measurement chassis 83.

Figure 2:
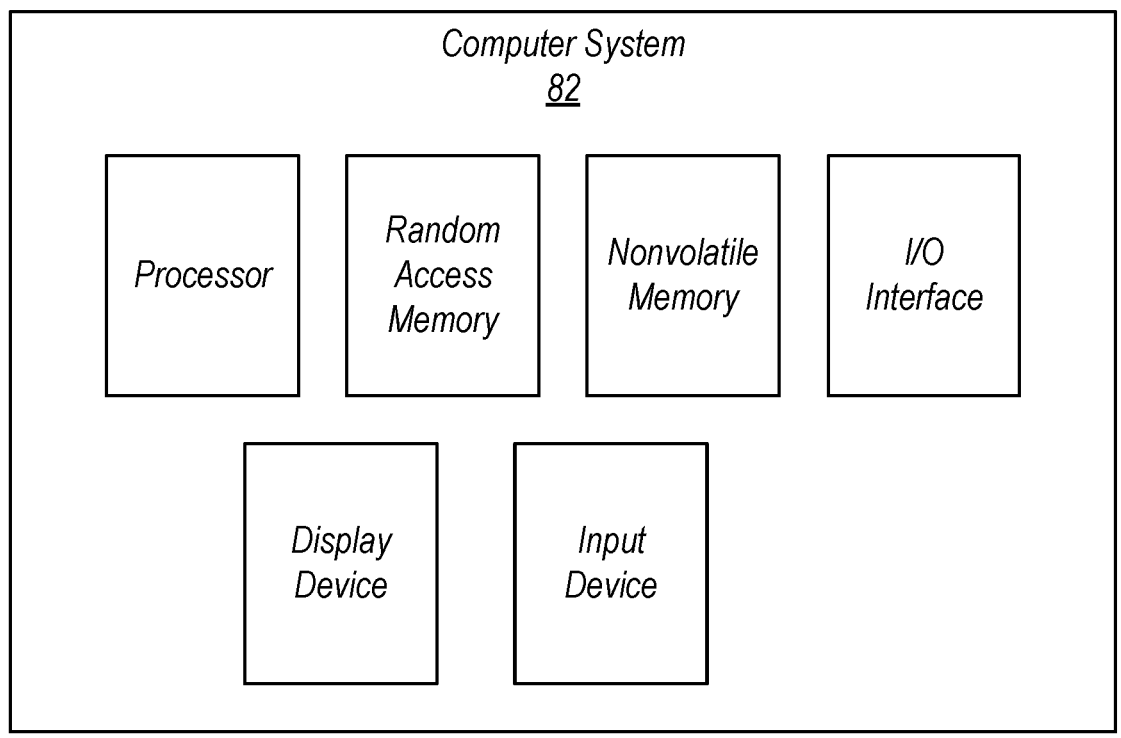
FIG. 2 shows a basic computer system block diagram, according to some embodiments.

FIG. 2—Computer System Block Diagram

FIG. 2 illustrates a simplified block diagram of the computer system 82. As shown, the computer system 82 may comprise a processor that is coupled to a random access memory (RAM) and a nonvolatile memory. The computer system 82 may also comprise an input device for receiving user input and a display device for presenting output. The computer 82 may also comprise an Input/Output (I/O) interface that is coupled to the testing apparatus 84. The I/O interface may be configured to supply signals to the PAS and/or the AUT to selectively stimulate the antennas on the PAS/AUT to generate electromagnetic radiation for transmission to the AUT/PAS. The I/O interface may further be coupled to the AUT and configured to receive electromagnetic signals measured by the AUT.

As shown in FIG. 2, the computer system 82 may include a processor, random access memory (RAM), nonvolatile memory, a display device, an input device and an I/O interface for coupling to the testing apparatus 84. For example, the computer system 82 may include at least one non-transitory computer-readable memory medium on which one or more computer programs or software components according to one embodiment of the present invention may be stored. For example, the memory medium may store one or more programs that are executable to perform the methods described herein. The memory medium may also store operating system software, as well as other software for operation of the computer system. Various embodiments further include receiving or storing instructions and/or data implemented in accordance with the foregoing description upon a carrier medium.

Figure 3:
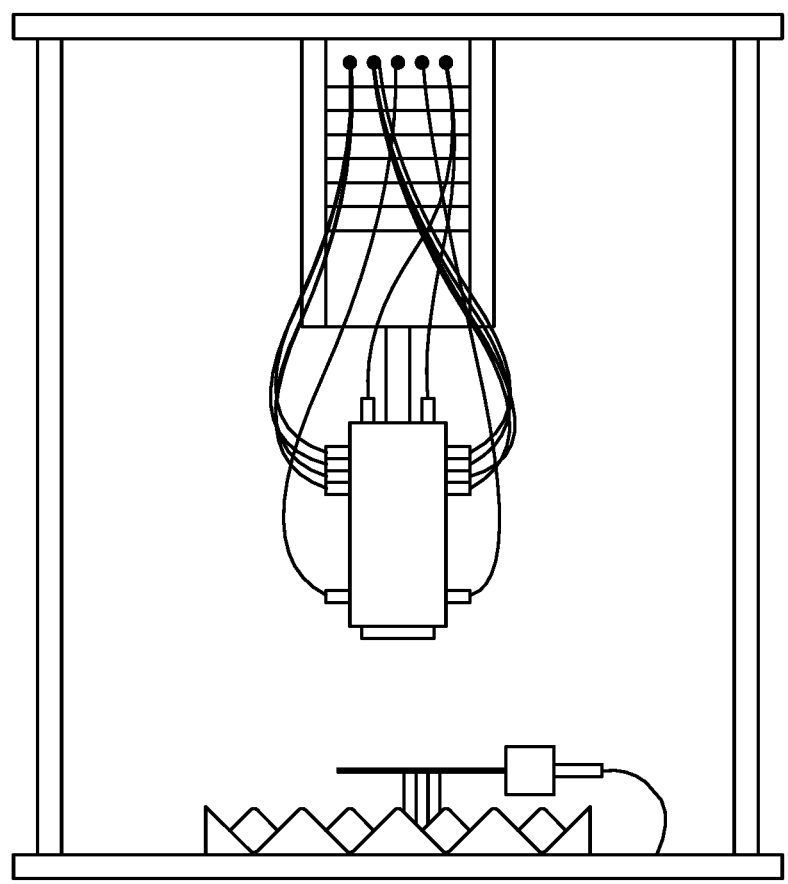
FIG. 3 shows an example of an testing chamber which supports or houses an antenna-under-test (AUT) or device-under-test (DUT) and which also includes a multiple probe antenna array installed within a mobile positioner for measuring electromagnetic signals from the AUT, according to some embodiments.
Figure 4:
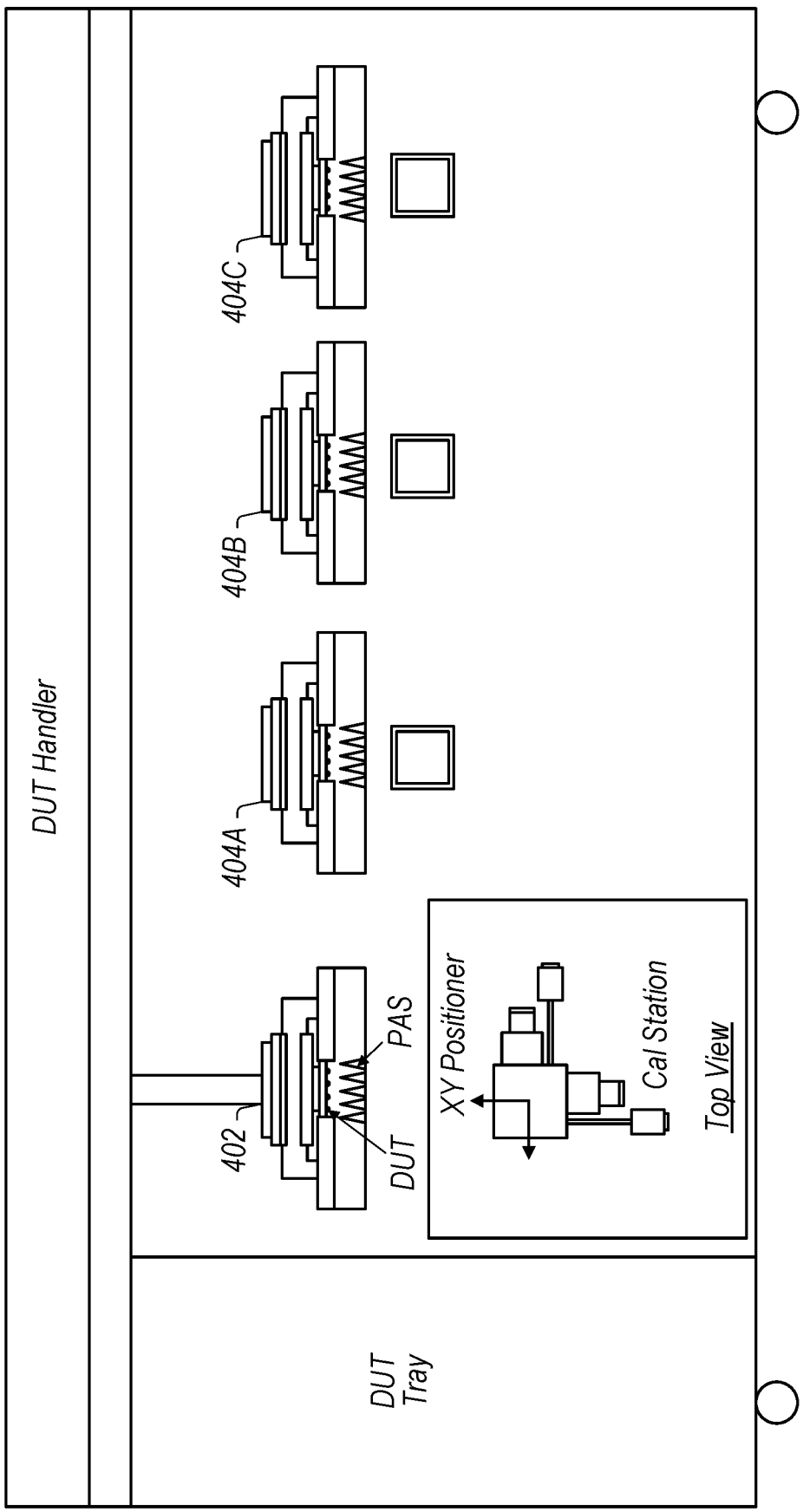
FIG. 4 illustrates a multi-DUT characterization system configured to perform OTA testing on multiple DUTs, according to some embodiments.
Figure 5:
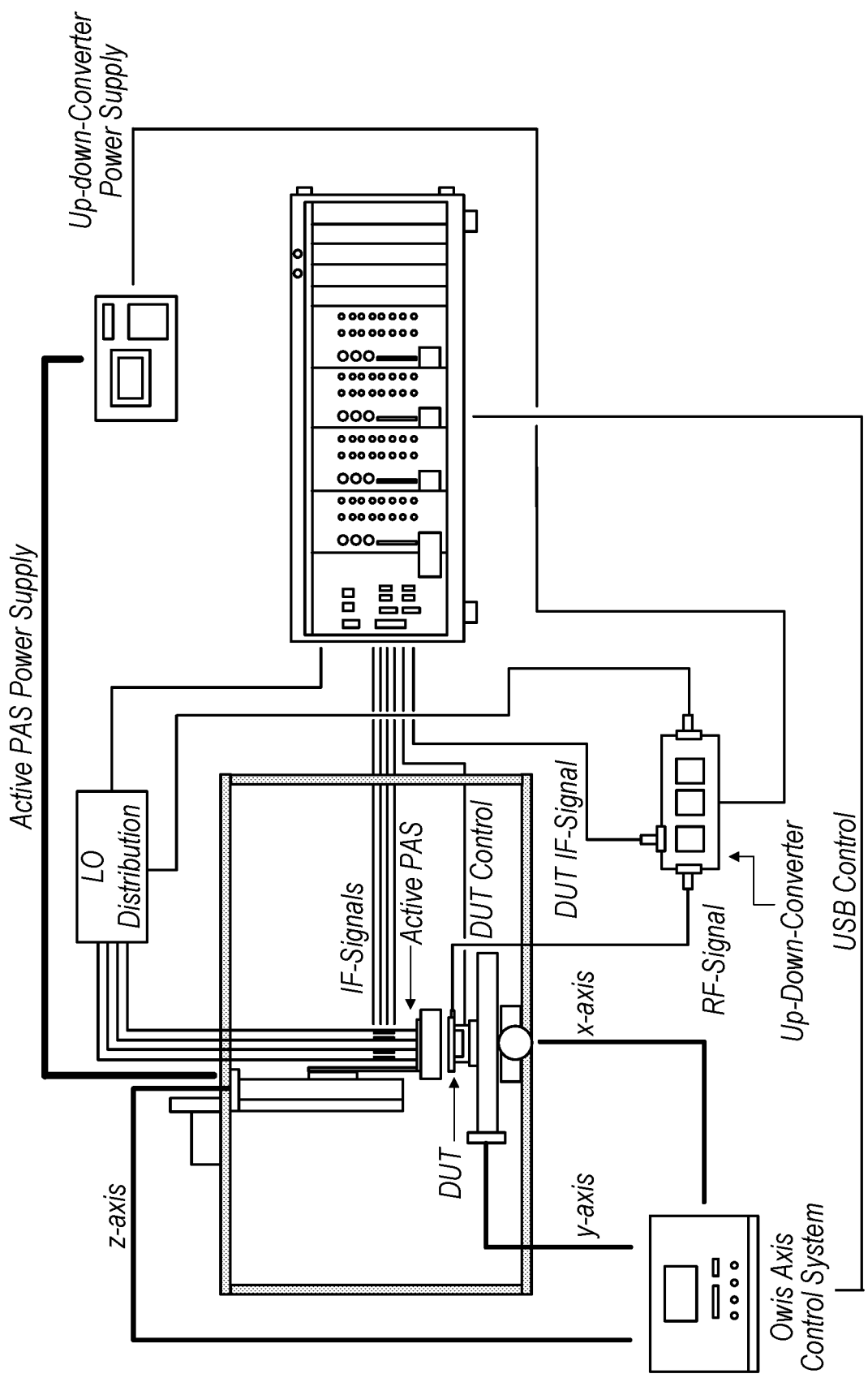
FIG. 5 illustrates a multi-probe near field scanner setup, according to some embodiments.

FIGS. 3-5: Testing Apparatus

FIG. 3 illustrates a multi-probe near-field (NF) scanner setup to implement embodiments described herein. As illustrated, a housing is configured to hold an AUT at a desired orientation. In some embodiments, a multi-probe NF scanner is positioned on a movable arm that is configured to scan over a NF area in the proximity of the AUT. In some embodiments, the AUT is moved relative to the probe array, or both the AUT and the probe array are moved (the probe array may be moved vertically while the AUT is moved in the horizontal plane, as one example). The testing apparatus may include absorbers positioned around the PAS, the AUT, on the walls of the chamber, and/or on the support structures of the housing for absorbing undesired electromagnetic signals during the electromagnetic radiation measurements. For example, surrounding the PAS and/or the AUT with an absorbing material may provide isolation between adjacent antennas and avoid reflections of the transmitted signal from the AUT and/or PAS.

FIG. 4 illustrates a multi-probe NF scanner integrated with a multi-site test station. The multi-probe NF scanner illustrated in FIG. 4, potentially using a PAS as its multi-probe array, results in a much-simplified user and maintenance experience for the calibration process of the PAS because it can be made very compact and merged into a multi-site test station. In turn, this also lowers the total cost of test and ownership for users. In FIG. 4, multiple stations are configured to hold respective AUTs in NF proximity to respective PASs. Station 402 is configured with an XY positioner that is configured to move the AUT (and/or the PAS) through a plurality of locations within a scan area. Stations 404A-C are configured to hold the AUT and the PAS in a static position to perform NF-to-FF signal reconstruction.

In some embodiments, the probe antennas may be embedded in an absorbing structure to optimize AUT-to-PAS coupling, reducing cross-coupling such that the PAS may be placed very close to the AUT within the so-called reactive NF zone of the AUT array. Advantageously, this may allow for the test apparatus to become very compact compared to typical implementations of classical NF scanners or other state-of-the-art antenna measurement setups.

FIG. 5 illustrates an example multi-probe near-field scanner setup implementing embodiments described herein. As illustrated, the system includes a measurement subsystem, the probe array, a positioning subsystem, and signal conditioning circuitry for the AUT. In various embodiments, the measurement subsystem may either create a stimulus for the AUT and receive the captured NF signals from the probes in the probe array or create stimuli for the probes and receive the captured NF signal from the AUT.

In some embodiments, the measurement subsystem further includes four Vector Signal Transceivers (VSTs), each combining one vector signal generator and one vector signal analyzer channel, to, in total, create a 4-channel measurement instrument. In some embodiments, the four channels may share a common reference to maintain consistent phase offsets between the channels. For example, a shared local oscillator signal or reference clock may be used as a common reference.

In some embodiments, the measurement subsystem further includes a peripheral component interconnect (PCI) eXtensions for Instrumentation (PXI) controller running software to configure and synchronize the instrumentation channels and the positioning subsystem, control the measurements and the movement of the probe array and AUT, perform the NF-to-FF transformation including the algorithms for coherent combining and compensation of multiple probes, and provide interfaces for remote control and data transfer. The measurement subsystem may additionally include a PXI chassis to house, power, and interconnect these components.

Figure 6:
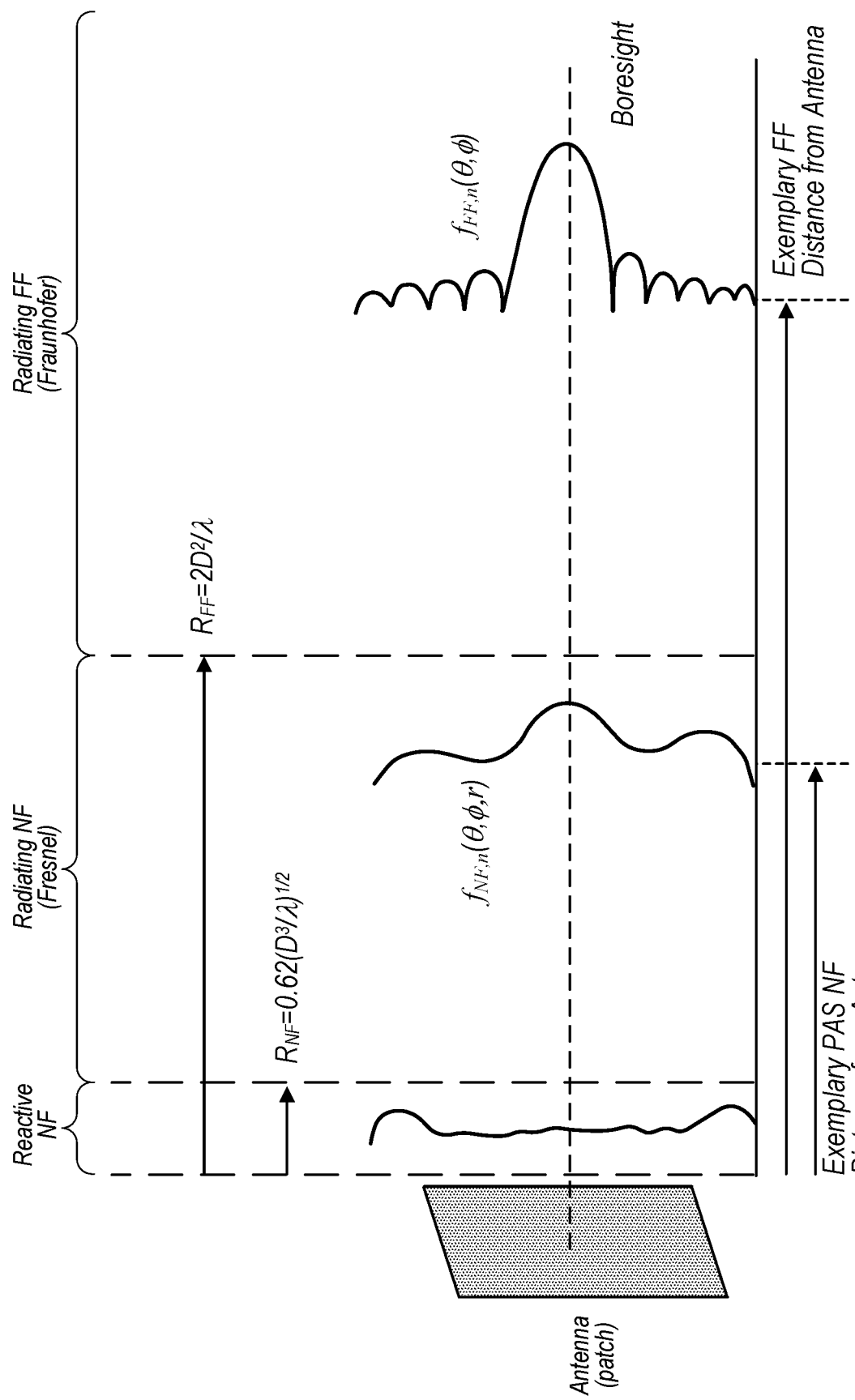
FIG. 6 illustrates field definitions related to wavelength and aperture size, according to some embodiments.

FIG. 6—Field Definitions

FIG. 6 illustrates various field definitions. There are two main distances that play an important role for OTA measurements. First the distance $R_{NF}$ where the reactive NF goes into the radiating NF as well as the distance $R_{FF}$ where the radiating NF goes into the (radiating) FF. For common OTA measurements $R_{FF}$ is most relevant because this is the distance that one can usually assume between a base station and a user terminal. Both distances depend on the antenna aperture size D and wavelength $\lambda$ and represent approximations. Details on how these borders are defined can be found, e.g., in the book from C. A. Balanis titled "*Antenna Theory—Analysis and Design*". The field definitions are summarized for a scenario where the AUT is the source of electromagnetic radiation (the AUT transmits electromagnetic energy associated with a signal) and a probe antenna or a plurality of probe antennas respond to that radiation, i.e., pick up energy from the corresponding electromagnetic field (these antennas receive electromagnetic energy associated with a signal). The below statements also hold for the case where the AUT receives and the probe antenna or plurality of probe antennas transmits.

As a rule of thumb, the distances $R_{NF}$ and $R_{FF}$ scale with the size of the transmitting antenna aperture (or the spatial extent of the antenna array) and the wavelength of the transmitted light as $R_{NF} \cong 0.62\sqrt{D^3/\lambda}$ and $R_{FF} \cong 2D^2/\lambda$. Note that these expressions are not universally accurate and may vary depending on antenna type. If one assumes a millimeter wave antenna at 28 GHz, which corresponds in vacuum to a wavelength of approximately 0.0107 m, one could obtain the following NF and FF distances: 1) when $D=\lambda/2 \approx 5.3$ mm$\rightarrow R_{NF}=2.3$ mm; $R_{FF}=5.3$ mm 2) when $D=10\lambda/2 \approx 5.3$ cm$\rightarrow R_{NF}=7.3$ cm; $R_{FF}=53$ cm One immediately sees that there is a significant difference whether to look at a single element antenna that is represented by example (1) or an antenna array that is represented by example (2).

In the FF, the electromagnetic field almost entirely comprises components that make the direction of power flux pointing strictly away from the source of radiation (e.g., a AUT's antenna), i.e., the field may be composed of radiating components only. One consequence of this is that the shape of the distribution of field strength both, in amplitude and phase, over space may be practically independent of the distance between the source of radiation and the observer. In other words, the distributions measured for two different distances in the FF may be (approximately) equal if normalized, e.g., to their individual peak values; the actual scaling of the non-normalized distributions may still depend on the distance. The shape of this distribution of field strength is often referred to as the FF pattern of the source antenna and is an important characteristic of a radiating AUT. If the probe antenna may be placed in the FF of the AUT then the AUT's FF pattern may be measured directly with the probe by repositioning the AUT and/or probe relatively to each other to a plurality of points on a sphere around the AUT.

In the NF, the closer the observer gets to the radiating source, the more the electromagnetic field will be impacted by reactive components such that more significant portions of power go back and forth between the radiating source and points in its NF. This may result in the distribution of field strength (both in amplitude and in phase) over space being dependent on the distance between source and observer (in both absolute value and shape). This also means that, in general, a probe antenna or array of probe antennas in the NF of the AUT may be coupled to the AUT and its presence may alter the properties of the electromagnetic fields radiating from the AUT. Conversely, an AUT in the NF of the probe antenna or array of probe antennas may be coupled to the probe antenna(s) and its presence may alter the properties of the electromagnetic fields radiating from the probe antenna(s).

OTA measurements in the radiating NF are possible with low coupling between the probe and AUT antenna, i.e., the presence of the probe antenna does not alter significantly the properties of the electromagnetic fields radiating from the AUT (this is different in the reactive NF where there is more coupling and the probe antenna does alter the AUT's radiation properties). Still, the shape of the distribution of field strength may still depend on the distance to the antenna.

Compared to previous implementations for determining FF transmission patterns from NF measurements, embodiments herein have improved measurement accuracy due to the combining gain of multiple measurements at each reception location. In addition, the measurement process may be made faster by subdividing the scan surface into different coverage areas for and parallel sampling of the multiple probes. In addition, the spatial far-field resolution may be increased as a result of the increased scan surface area of the probe array. Embodiments herein improve upon previous implementations that utilize a single probe, which involve the single probe traveling across a potentially large scan surface, visiting a large number of points, and with a baseline dynamic range/signal-to-noise ratio.

As used herein, the unqualified term "near field" (NF) encompasses both the reactive and the radiating NF.

Combining Multiple Probe Antennas in Over-the-Air Antenna Measurements

Embodiments herein present systems and methods for processing near-field (NF) measurement data performing coherent combinations of data from multiple probes. Advantageously, the described methods increase measurement accuracy due to the increased gain of combining signals from multiple probes. In addition, the measurement process may be accelerated by subdividing the scan surface into different coverage areas for parallel sampling by the multiple probes. The spatial far-field resolution may be increased by effectively increasing the scan surface area.

Embodiments herein present various advantages over previous methodologies. For example, the array of multiple probes may be able to obtain a sufficient number of measurements (e.g., sufficient for a desired threshold degree of accuracy of the AUT characterization) with a smaller number of scan positions of the apparatus, since each scan performs multiple measurements. Accordingly, the scan time may be significantly reduced. In addition, AUT characterization methods that utilize a single probe antenna may produce inaccurate results when deficiencies in the design or realization of the probe antenna or the measurement receiver (or generator) circuitry may directly translate into reduced gain for the NF measurements, thus limiting their dynamic range. This, in turn, can limit the measurement accuracy.

Utilizing a plurality of probe antennas to characterize AUT performance may mitigate these concerns, at least to some degree. For example, embodiments herein solve these shortcomings by using a probe array like the PAS. An array of probes covers a much larger area than a single probe so movement trajectories may be shortened, and acceleration/deceleration profiles may be optimized to result in faster scans. The probe array may be made large enough to cover the entire scan area, and the spacing of its elements small enough to meet the spatial sampling specifications. In this case, the NF scanning may be performed without any probe and/or AUT movement altogether which may be the fastest way to scan.

The use of multiple probes may also lead to higher measurement accuracy as multiple measurements may result in an averaging gain. This is due to an increased signal level from combining the multiple measurements compared to a constant noise level, i.e., an increase in the measurement's signal-to-noise ratio (SNR).

In some embodiments, by utilizing the described methods and systems, existing NF probe antenna systems (PASs) may be improved by shrinking the size of the calibration system, thus lowering costs. In some embodiments, a multi-probe NF scanner may be utilized as a standalone product, involving either mechanical positioning of the probe array over the scan surface, or using low-cost array technology like metasurfaces to scale the probe array to cover the entire scan surface.

Embodiments herein utilize near-field (NF) measurement methods to measure the radiation characteristics such as field strength or radiated power distributions over space, and dependent performance metrics like beam width, modulation quality, or spectral purity. In some embodiments, these characteristics are determined for the far-field (FF) of the antenna under test (AUT) based on the NF measurements.

Typically, measurements of an antenna are made to determine its FF zone radiation characteristics. FF and NF characteristics are related to each other but differ in their properties. However, embodiments herein determine FF characteristics from observations in the NF.

NF scanners measure the field strength (amplitude) as well as phase along specific scan surfaces near the AUT. The surface may be a (truncated) plane in which case the apparatus is called a planar NF scanner. Other possible practical surfaces are cylinders or spheres centered about the AUT giving rise to cylindrical or spherical NF scanners. When the field strength and phase are measured with a sufficient density of points on these surfaces, it is possible to apply a so-called NF-to-FF transform to the measured data and get the FF radiation characteristics of the AUT.

Existing NF scanners typically use a single probe antenna to take the NF measurements. The probe may be dual polarized to take measurements of two orthogonal polarization planes. During a NF scan, the probe, the AUT, or both are moved relative to one other to sample a scan area.

The field E(x, y, z) of a monochromatic wave radiated by an antenna aperture, evaluated at a point with Cartesian coordinates (x, y, z), may be expressed as a superposition of "modal" waves. Specifically, this modal representation—called a "spectrum" herein—may be computed from the amplitude and phase data sampled by a NF scanner across the scan surface. From this "modal spectrum" it is possible to analytically derive the FF patterns $E(r \to \infty, \theta, \phi)$ of the antenna, evaluated in the direction of the spherical angles ($\theta$, $\phi$) at a far distance from the antenna (e.g., at a FF distance). Planar, cylindrical, and spherical NF scanners express the field in plane, cylindrical, and spherical waves, respectively.

E.g., for the planar case, with the antenna aperture facing towards the +z axis, the field on a plane at z=d is related to plane waves of the form $f(k_x, k_y)\exp(-jkr)$, with k denoting the wave vector with Cartesian components ($k_x$, $k_y$, $k_z$) and r denoting the spatial vector with Cartesian coordinates (x, y, z), by a 2D spatial Fourier transform as:

$$E(x, y, z = d) = \frac{1}{4\pi^2} \int_{-\infty}^{\infty} \int_{-\infty}^{\infty} f(k_x, k_y) e^{-jkr} dk_x dk_y \quad (1)$$

The plane waves $f(k_x, k_y)$ are vector fields with different amplitudes and phases as $k_x$ and $k_y$ vary, but the same frequency.

A planar NF scanner samples the field E(x, y, z) at z=d and calculates the plane wave spectrum at this distance over the aperture of the antenna. The field E(x, y, z=d) is measured over a rectangular area with side lengths a and b and sample spacings $\Delta x$ and $\Delta y$ in the x- and y-directions, respectively. For an electric field that is measured over continuous points in space, the x and y components of the plane wave spectrum are calculated as:

$$f_x(k_x, k_y) = \int_{-\frac{b}{2}}^{\frac{b}{2}} \int_{-\frac{a}{2}}^{\frac{a}{2}} E_x(x, y, z = d) e^{-j(k_x x + k_y y)} dx dy \quad (2)$$

$$f_y(k_x, k_y) = \int_{-\frac{b}{2}}^{\frac{b}{2}} \int_{-\frac{a}{2}}^{\frac{a}{2}} E_y(x, y, z = d) e^{-j(k_x x + k_y y)} dx dy \quad (3)$$

Note that while Equations (2) and (3) are expressed as integrals over continuous space, these expressions may be modified to a discrete Fourier transform for the case of a set of electric field sample measurements at discrete points in space. For example, when the field E(x, y, z=d) is sampled over a rectangular area with side lengths a and b and sample spacings $\Delta x$ and $\Delta y$ in the x- and y-directions, respectively, the x and y components of the plane wave spectrum are calculated as:

$$f_x(k_x, k_y) = \quad (4)$$
$$\sum_{n_x=-\frac{a}{2\Delta x}}^{\frac{a}{2\Delta x}} \sum_{n_y=-\frac{b}{2\Delta x}}^{\frac{b}{2\Delta x}} E_x(n_x \Delta x, n_y \Delta y, z = d) e^{-j(k_x n_x \Delta x + k_y n_y \Delta y)}$$

$$f_y(k_x, k_y) = \quad (5)$$
$$\sum_{n_x=-\frac{a}{2\Delta x}}^{\frac{a}{2\Delta x}} \sum_{n_y=-\frac{b}{2\Delta x}}^{\frac{b}{2\Delta x}} E_y(n_x \Delta x, n_y \Delta y, z = d) e^{-j(k_x n_x \Delta x + k_y n_y \Delta y)}$$

The far field pattern can be expressed in terms of the plane wave spectrum $$E_\theta(r, \theta, \phi) \cong j \frac{ke^{-jkr}}{2\pi r} (f_x \cos\phi + f_y \sin\phi) \quad (6)$$

$$E_\phi(r, \theta, \phi) \cong j \frac{ke^{-jkr}}{2\pi r} \cos\theta(-f_x \sin\phi + f_y \cos\phi) \quad (7)$$

The size of the scan surface determines the angular resolution of the FF pattern in a similar way as the bandwidth of a radio signal corresponds to the time interval to sample that signal and retain all the information within the signal. It is also related to the range of angles $[-\theta_v, \theta_v]$ on which the reconstructed FF pattern can be expected to be accurate. Here, the so-called maximum untruncated angle $\theta_v$ is given by $$\theta_v = \tan^{-1}\left(\frac{a-L}{2d}\right) \quad (8)$$

where a is the side length of the scanning plane, L the maximum aperture dimension of the AUT and d the distance between probe and AUT.

Note that Equations 1-7 describe a Cartesian Fourier transform to extract FF patterns from NF electric field measurements. In some embodiments, spherical or cylindrical wave transforms may be used in cases where the scan map is a spherical or cylindrical surface, respectively. Other geometries are also possible (e.g. a torus-shaped or a hyperbolic scan map surface), in which case a Fourier transform expressed in the corresponding geometry may be used to extract the FF pattern from NF electric field measurements.

The Nyquist criterion for sampling specifies that the spacing of the measurement points should be smaller than half the wavelength of the signal for accurate results. For distances between the AUT and the scan plane approaching the far-field region, the spacing may be close to half a wavelength. As the distance is reduced, e.g., to comply with size constraints, a smaller spacing may be chosen. For example, consider a frequency of 30 GHz, corresponding to a wavelength of $\lambda$=10 mm, and a scan surface area of 200×200 mm. Selecting a sample spacing of $\lambda$/4, this translates to 6561 measurement points. Depending on the size of the AUT the scan surface may be increased. Depending on accuracy requirements, the sample spacing may be reduced. In both cases, the number of measurement points can become significantly larger.

In some embodiments, the probe antenna(s) may have a spatially varying gain, and so, in measuring the AUT transmission, they may be more sensitive to radiation coming in from, say, the direction of its boresight axis compared to radiation from some other angle. Similarly, in measuring the AUT in receive mode, the radiation the probe antenna produces may have different field strengths depending on the direction from which it impinges on the AUT.

If, during a NF scan, the probe changes its alignment relative to the AUT—i.e., the angle between an axis connecting the AUT and the probe and the boresight axis of the probe varies—the different NF measurements may be taken with variations in the effective amplitude gain and, potentially, phase shift between the probe antenna and the measurement receiver. Additionally, due to the probe movement, the effective distance between the AUT and the probe antenna may change. In turn, this contributes further to amplitude variations in the NF measurements. This effect is larger for the results of planar or cylindrical NF scanners.

These amplitude and phase variations, if unaccounted for, may be detrimental to measurement accuracy. This is because the NF-to-FF transformation assumes the input NF values are observed with a constant amplitude gain and phase shift of the measurement system. To account for the impact of variations in the probe alignment relative to the AUT, some embodiments employ probe compensation schemes to determine spatially dependent correction patterns for the probe that get applied before, during, or after the actual NF-to-FF transformation to correct either the raw NF data, its modal spectrum, or the resulting FF characteristics.

In various embodiments, parameters of the AUT scanning procedure may be adjusted to obtain a desired balance between scan duration and accuracy. For example, a shorter scan duration may be achieved if each point on the scan surface is measured once only by any one of the probes. In this case, one may expect the accuracy of a state-of-the-art single-probe NF scanner. Alternatively, higher accuracy may be achieved if each probe measures each point. In this case, one may expect the measurement speed of a state-of-the-art single-probe NF scanner. Advantageously, embodiments herein may smoothly control the balance between these two extreme behaviors through the method of combining the NF measurements, as described in greater detail below.

Embodiments herein describe systems and methods to coherently combine the NF measurements made by the multiple probes in the NF-to-FF transform such that the measurement speed and/or accuracy may be improved. Furthermore, in some embodiments probe compensation is performed for an array of probes to enable accurate measurements.

Figure 7:
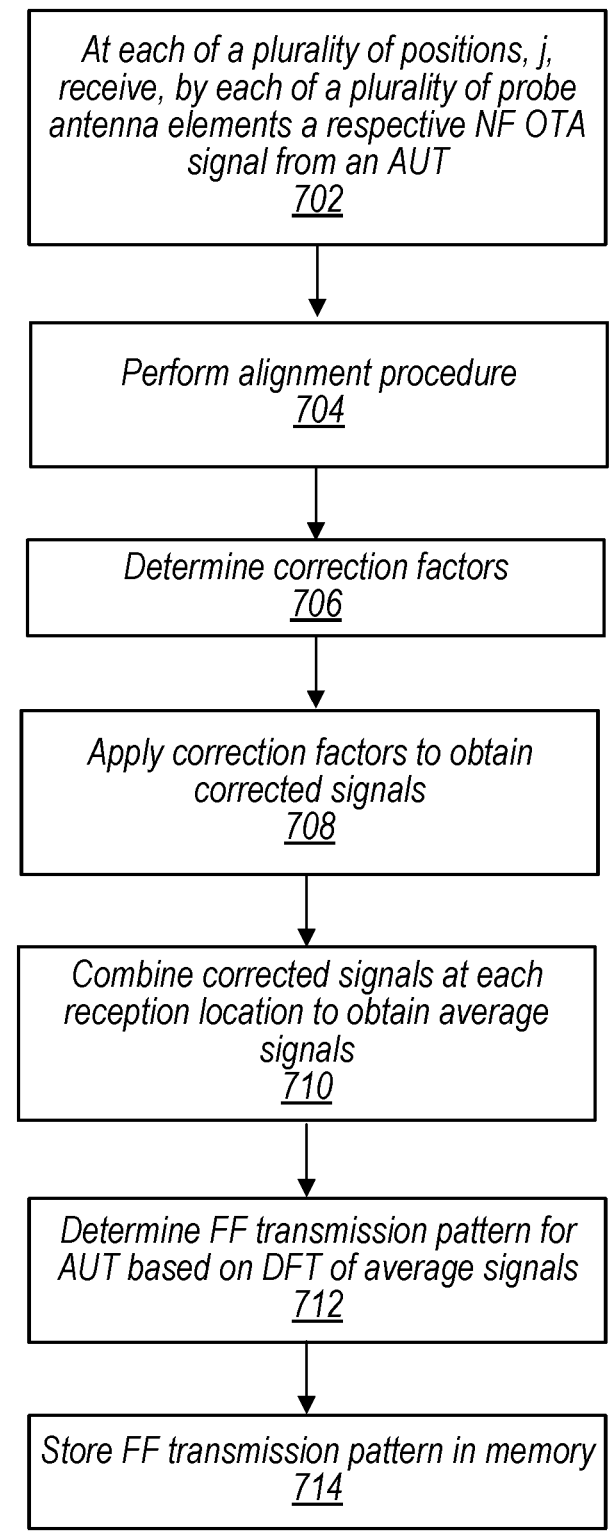
FIG. 7 is a flowchart diagram illustrating a method for using a multi-probe receiver to characterize a far-field transmission pattern of an AUT, according to some embodiments.

FIG. 7—Flowchart—Determination of FF Transmission Pattern from Multi-Probe Scan

FIG. 7 is a flowchart diagram illustrating a method for determining a FF transmission pattern of an AUT by utilizing a multi-probe scan, according to some embodiments. The method shown in FIG. 7 may be used in conjunction with any of the computer systems, memory media or devices shown in the above Figures, among other devices. For example, a processor of a computer system 82 may execute program instructions stored in memory to direct the AUT, the measurement apparatus 84, and/or the multi-probe receiver to perform the described methods steps. The processor may further perform calculations based on signals received from the AUT and/or the measurement apparatus. In various embodiments, some of the method elements shown may be performed concurrently, in a different order than shown, or may be omitted. Additional method elements may also be performed as desired. As shown, this method may operate as follows.

At 702, at each respective position, j, of a plurality of positions within a scan area, each probe antenna element of the plurality of probe antenna elements receives a respective near-field (NF) over-the-air (OTA) signal from the AUT as an electric field vector, $\vec{E}(i,j)$, where i denotes the respective probe antenna element of the receiver and j denotes the respective position.

In various embodiments, the AUT and/or a probe receiver may be sequentially moved to each of the plurality of positions. For example, the probe receiver may be moved to each position within the scan area while the AUT remains fixed, or the AUT may be moved to each position while the probe receiver remains fixed. Alternatively, both the AUT and the probe receiver may be moved. Note that "position" refers to the relative position of the AUT and a reference point on the probe receiver. The plurality of positions is selected to cover a desired scan map for the AUT, where the scan map may be rectilinear, spherical, cylindrical, or more generally of any desired shape. Note that the modal spectra used to perform the NF-to-FF signal reconstruction may vary depending on the shape and the symmetry properties of the scan map.

Figure 14:
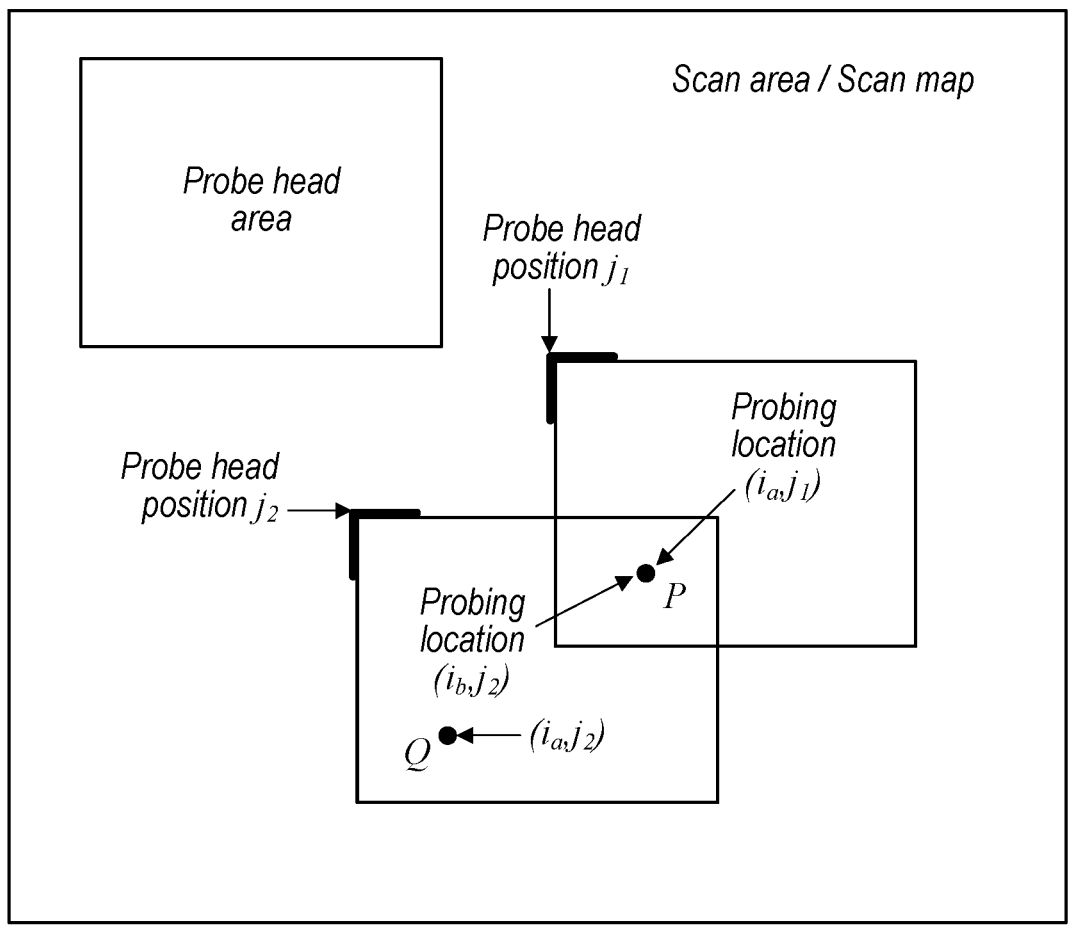
FIG. 14 illustrates probe positions and probing locations within a scan map, according to some embodiments.

As one example, when both the AUT and the probe receiver are moved, the AUT may be moved along the x-direction and the probe receiver may be moved along the y-direction, or one device may be moved in the horizontal plane while the other is moved vertically. Other combinations are also possible. As illustrated in FIG. 14, the position may be identified as an arbitrary position on the probe receiver (the probe head, as illustrated), as distinguished from probing locations, which refer to the location of a particular antenna of the probe receiver within the array.

The receiver may include an array of a plurality of probe antenna elements. In some embodiments, the receiver is a probe antenna system (PAS), or it may be another type of receiver that includes a plurality of antenna probes.

The two polarizations of the electric field may be received sequentially or in parallel, in various embodiments. To avoid confusion, note that "position" refers to the location in space of the receiver relative to the AUT, whereas "reception location" refers to the precise location of each probe antenna element of the receiver relative to the AUT when it receives a NF OTA signal from the AUT.

Figure 12A:
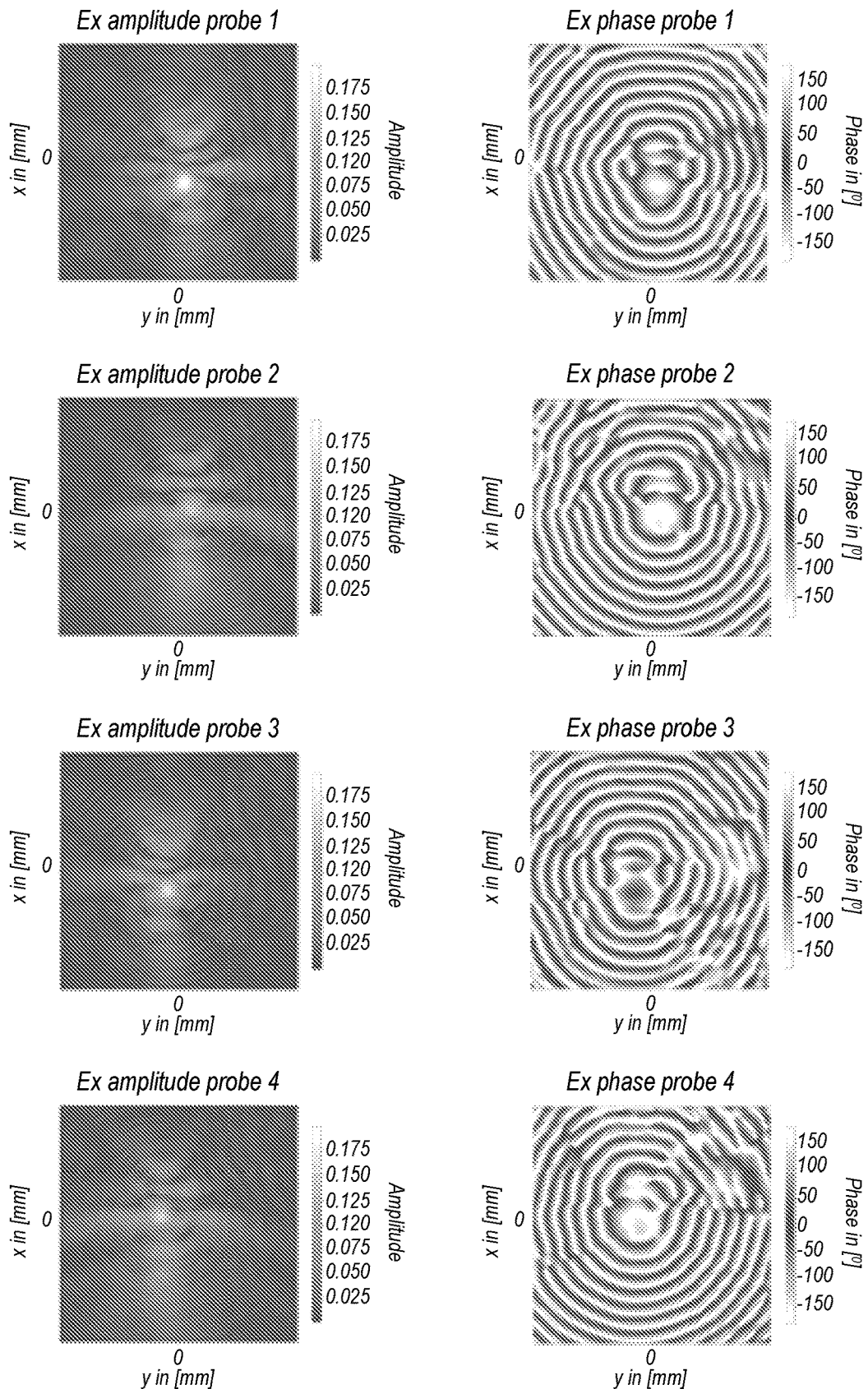
FIGS. 12A-B illustrates amplitude and phase signal maps for a plurality of antenna probes, according to some embodiments.
Figure 12B:
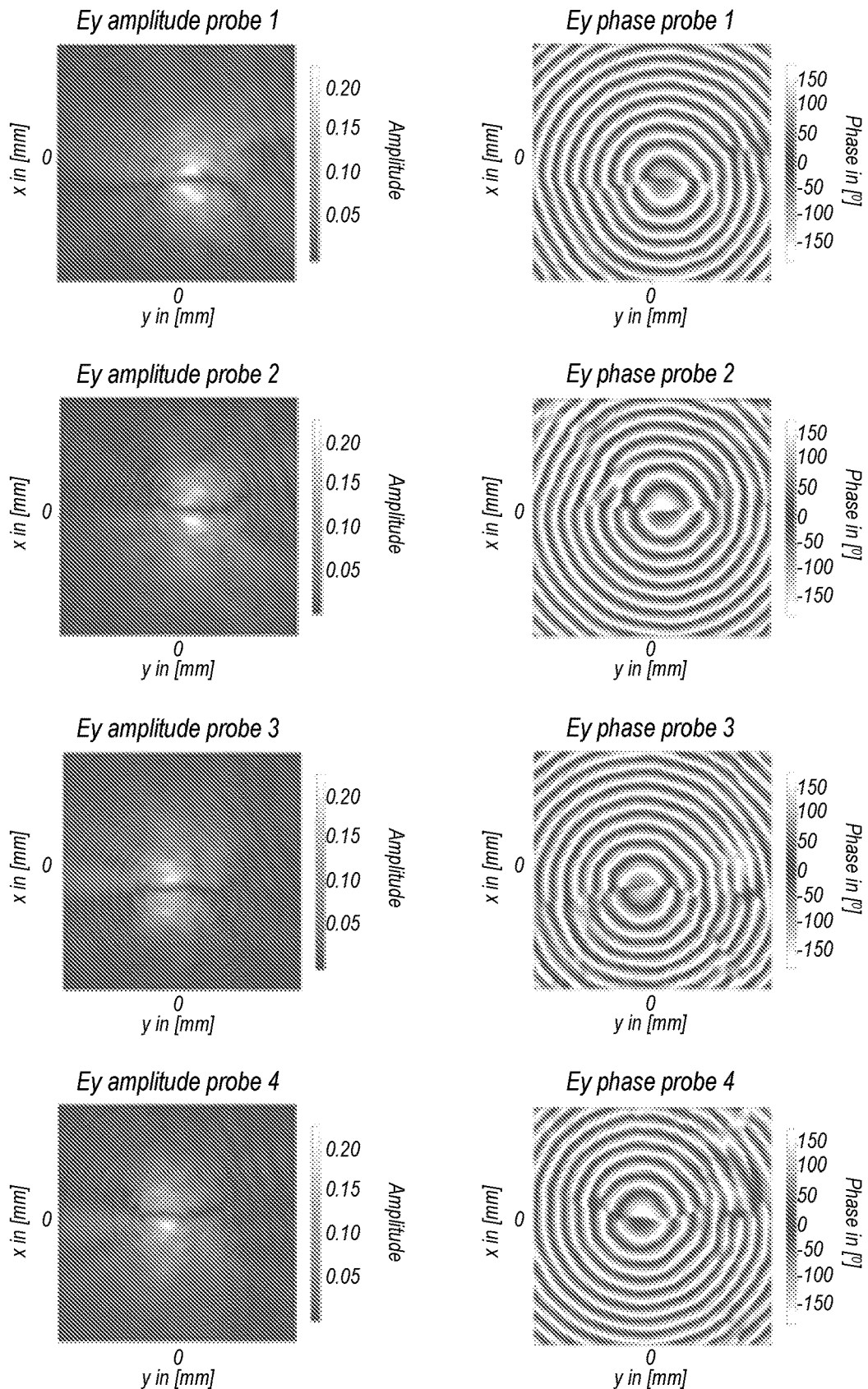

For each probe antenna element, the received NF OTA signals may be used to construct a scan map for the respective probe antenna element, which is a map of the received signals at each reception location where the respective probe antenna element received a signal. Some examples of scan maps are illustrated in FIGS. 12A-B, where the x and y components of both the amplitude and phase of the received signals are illustrated in separate scan maps for 4 different probe antenna elements.

At 704, an alignment procedure is performed to spatially align the reception locations for signals received by different ones of the plurality of probe antenna elements. In some embodiments, the alignment procedure may be performed based on precise construction specifications of the receiver. For example, the receiver may have been constructed to precisely defined specifications that are provided in a spec sheet, such that the user has sufficiently precise knowledge (i.e., sufficiently precise to obtain a desired precision for the FF transmission pattern determination) of the relative positions of each of the probe antenna elements of the array. In these embodiments, the alignment procedure may simply align the reception locations of signals received throughout the scan procedure by each probe antenna element based on their known positions in the array relative to each other. Accordingly, alignment will identify two signals received by two probe antenna elements at the same physical point in space (relative to the AUT) as being received at the same reception location, such that these two signals may be subsequently combined (along with any other signals that may have been received at that reception location). Note that, in the case where the distance between subsequent positions of the receiver during the scan and the distance between adjacent reception locations of the probe antenna elements are non-commensurate, reception locations may be identified as coinciding if they are within a predetermined threshold distance of one another. In some embodiments, alignment may be performed using mechanical measurements. For example, in some embodiments precision lasers may be used to precisely measure the relative locations of each probe antenna element of the PAS, and these relative locations may be used to perform alignment. More generally, any type of imaging or measurement procedure may be used to determine the relative locations of the probe and perform alignment.

In some embodiments, the receiver may not be provided with sufficiently accurate construction specifications to facilitate alignment, and a manual alignment procedure may be performed. In these embodiments, performing the alignment procedure may include, at each of the plurality of positions within the scan area, receiving, by each probe antenna element of the plurality of probe antenna elements, a respective NF OTA calibration signal from a calibration antenna as an electric field vector, $\vec{E}_c(i, j)$, wherein i denotes the respective probe antenna element of the receiver and j denotes the respective position. The NF OTA calibration signal may be constructed to have one or more clearly identifiable spatial features within the scan area. For example, the NF OTA calibration signal may exhibit a peak amplitude at or near a central point of the scan area, and/or concentric roughly circular iso-phase curves with clearly defined centers.

The alignment procedure may proceed by identifying one or more of these features for the scan map measured by a reference probe antenna element as a "reference reception location," which is a particular reception location that is used as a reference point for performing alignment. For example, the reference reception location may be identified as the reception location where the reference probe antenna element received a largest amplitude reference calibration signal, or as the center of concentric iso-phase curves in the phase scan map of the reference probe antenna. In some embodiments, two reference reception locations may be determined based on both the largest amplitude signal and the center of the iso-phase curves, and these locations may be averaged to obtain an average reference reception location to use for alignment (and potentially also for determining the correction factors, as described below).

In some embodiments, the NF OTA calibration signal may include multiple identifiable features (e.g., multiple amplitude peaks within the scan area), and multiple respective reference reception locations may be determined. The alignment procedure may then be performed separately for each reference reception location, and the results may be averaged to obtain the overall alignment. In some embodiments, the average of the separate alignment procedures may be weighted based on signal-to-noise ratios (SNRs) of signals received at the different reference reception locations.

Respective second reception locations may then be identified where the same feature(s) are identified for the scan maps of the other probe antenna elements as for the reference probe antenna element. As used in this description, these other probe antenna elements are sometimes referred to as "second" probe antenna elements, to distinguish them from the reference probe antenna element. The second probe antenna elements include all of the probe antenna elements other than the reference probe antenna element. The reception locations may then be aligned for each respective probe second antenna element based on differences between the reference reception location and the respective second reception locations. Accordingly, the scan maps of each probe antenna element may be aligned such that signals received at the same reception location by different probes may be identified for subsequent combination at step 710.

At 706, a plurality of respective correction factors is determined that characterize amplitude and phase discrepancies between a reference probe antenna element of the plurality of probe antenna elements and respective other (second) probe antenna elements of the plurality of probe antenna elements. The correction factors may be complex valued and may encode both amplitude and phase discrepancies in the signals received by the second probe antenna elements relative to those received at the same reception location by the reference probe antenna element.

In some embodiments, determining the plurality of respective correction factors includes identifying a reference signal received by the reference probe antenna element at a reference reception location, identifying respective second signals received by the second probe antenna elements at the reference reception location, and determining the respective correction factors based at least in part on respective differences between a reference amplitude and phase of the reference signal and respective amplitudes and phases of the respective second signals. Accordingly, each probe antenna element other than the reference probe antenna element may have a respective correction factor determined for it that characterizes the differences in amplitude and phase of signals received by the probe antenna element and those received by the reference probe antenna element at the reference reception location. The reference reception location used for determining the correction factors may generally be the same as or different from the reference reception location(s) used to perform the alignment procedure, in various embodiments.

In some embodiments, identifying the reference signal (and thereby also the reference reception location) includes identifying that the reference signal has a highest signal-to-noise ratio of all signals received by the reference probe antenna. The highest signal-to-noise ratio may be identified for the reference probe antenna element after performing probe compensation, in some embodiments. In some embodiments, the reference signal may be the same signal used to perform the alignment procedure, or it may be a separate reference signal received at a different reference reception location.

In some embodiments, rather than determining the correction factors based on an individual reference signal received by the reference probe antenna element and individual signals received by the other probe antenna elements at the reference reception location, the amplitude and phase may be averaged over a small region surrounding the reference reception location for both the reference probe antenna element and the other probe antenna elements. For example, a reference average may be determined of the reference amplitude and phase and a first plurality of amplitudes and phases of signals received by the reference probe antenna element in a first region surrounding the reference reception location. In addition, for each of the other probe antenna elements, a respective second average may be determined of the respective amplitude and phase of the respective second signal and a respective second plurality of amplitudes and phases of signals received by the respective probe antenna element in the first region. The respective correction factors may then be determined based on respective differences between the reference average and the respective second averages. Advantageously, correction factors determined based on this averaging procedure may be less sensitive to noise or aberrant signal error.

At 708, respective correction factors are applied to NF OTA signals received by the respective probe antenna elements to obtain corrected signals. The corrected signals are corrected to have the same amplitude response and to be in-phase with signals received by the reference probe antenna element at the same reception location. For example, differences in probe response, cabling, and other hardware discrepancies may cause amplitude and phase-response differences between the probe antenna elements. The phase correction enables the signals received at each reception location to be combined coherently without introducing destructive interference. The correction factors correct for deviations in amplitude response and phase between different probe antenna elements, relative to the reference probe antenna element.

At 710, for each respective reception location within the scan area, the corrected signals received at the respective reception location are combined to obtain a respective average signal. Towards the center of the scan area, a larger number of corrected signals will typically be combined (e.g., since a larger number of probe antenna elements generally traverse the center of the scan area), whereas the outer region of the scan area will often have a smaller number of corrected signals to combine (potentially just one at the edge of the scan area). For each reception location, all of the corrected signals received at that reception location (or within a predetermined threshold distance of the reception location, e.g., half of the distance between adjacent positions of the receiver) may be combined through an averaging procedure. In some embodiments, the averaging procedure is weighted based on a SNR or another quality metric of the corrected signals, such that higher SNR signals are granted a larger weight in the averaging procedure. The result of the averaging process may be an average corrected signal for each reception location.

Figure 10:
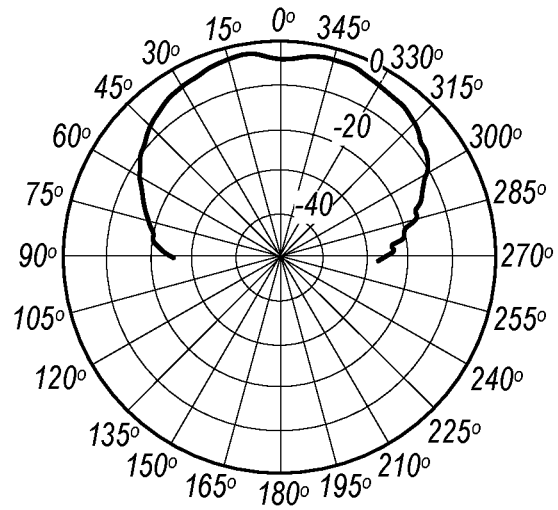
FIG. 10 illustrates a near-omnidirectional amplitude pattern for a calibration antenna, according to some embodiments.
Figure 10:
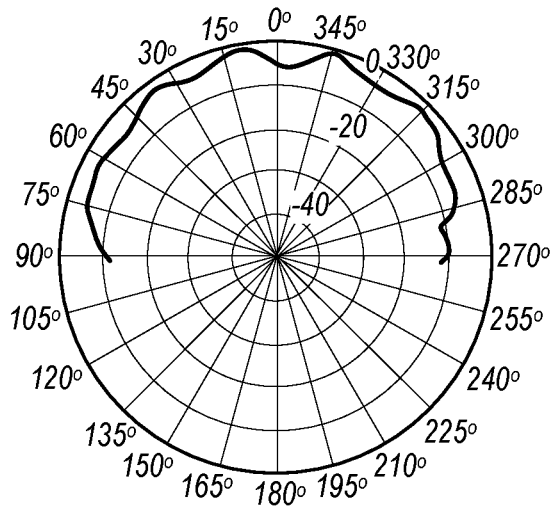
Figure 10:
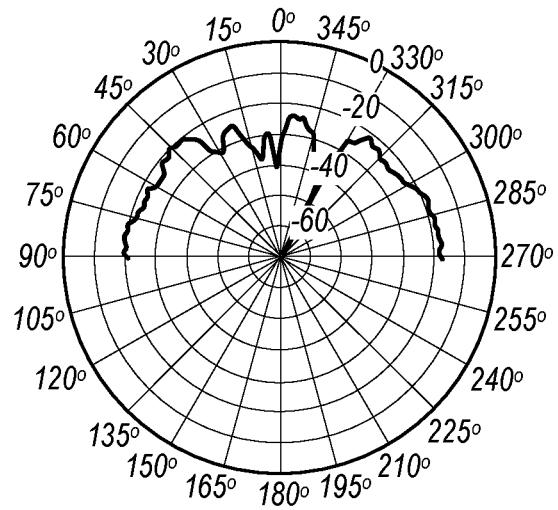
Figure 10:
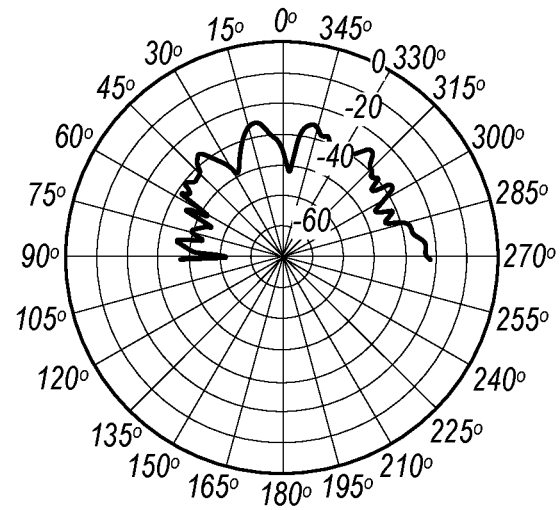

In some embodiments, probe compensation is performed for each probe antenna element to correct for discrepancies in reception sensitivity of the probe antenna elements at different reception locations. For example, different reception locations may be at different distances from the AUT and/or oriented at different angles relative to the AUT such that the sensitivity of the probe antenna elements vary between different reception locations. To perform probe compensation, at each respective position, j, of the plurality of positions, each respective probe antenna element receives a respective NF OTA calibration signal from a calibration antenna as an electric field vector, $\vec{E}_c(i, j)$, where i denotes the respective probe antenna elements and j denotes the respective position. The NF OTA calibration signals may be specially designed omnidirectional OTA signals with relatively constant amplitude over the scan area, such as is illustrated in FIG. 10.

Probe compensation may be performed by, for each respective probe antenna element, correcting for amplitude and phase discrepancies for signals received by the respective probe antenna element at different reception locations relative to the known spatial profile of the calibration signal.

In some embodiments, probe compensation is performed by determining a modal probe compensation spectrum based on the average signals. This may include determining a first modal representation of a spatial map of the respective average signals and determining a second modal representation of a spatial map of a plurality of calibration signals, where the second modal representation reflects an undistorted reception pattern for the AUT (e.g., the second modal representation may be obtained directly via far-field measurements). The modal probe compensation spectrum may be determined from the difference between the first and second modal representations. The modal probe compensation spectrum may be applied to the average signals to obtain probe-compensated average signals, and the FF transmission pattern for the AUT may be determined by performing a discrete Fourier transform on the probe-compensated average signals. The probe antenna elements may have different sensitivities to different spatial modes, and the probe compensation may correct for these discrepancies.

At 712, a far-field (FF) transmission pattern is determined for the AUT based at least in part on a discrete Fourier transform of the respective average signals. In some embodiments, the DFT may be performed on the probe-compensated average signals. For example, Equations 1-7 above and the associated description describe how the FF transmission pattern may be determined based on received NF signals.

The average signals may provide a more accurate and precise map of the NF electric field transmission from the AUT than would be obtained from a single probe scan, or from a stationary multi-probe measurement, which may enable a more accurate determination of the FF transmission pattern at lower cost and without the expense of utilizing a large (e.g., size of the FF distance) anechoic chamber.

At 714, the FF transmission pattern is stored in a non-transitory computer readable memory medium. The FF transmission pattern may be useable for quality control during an AUT manufacturing process, to characterize specifications of a manufactured AUT, and/or for other AUT characterization purposes, as desired.

Figure 8:
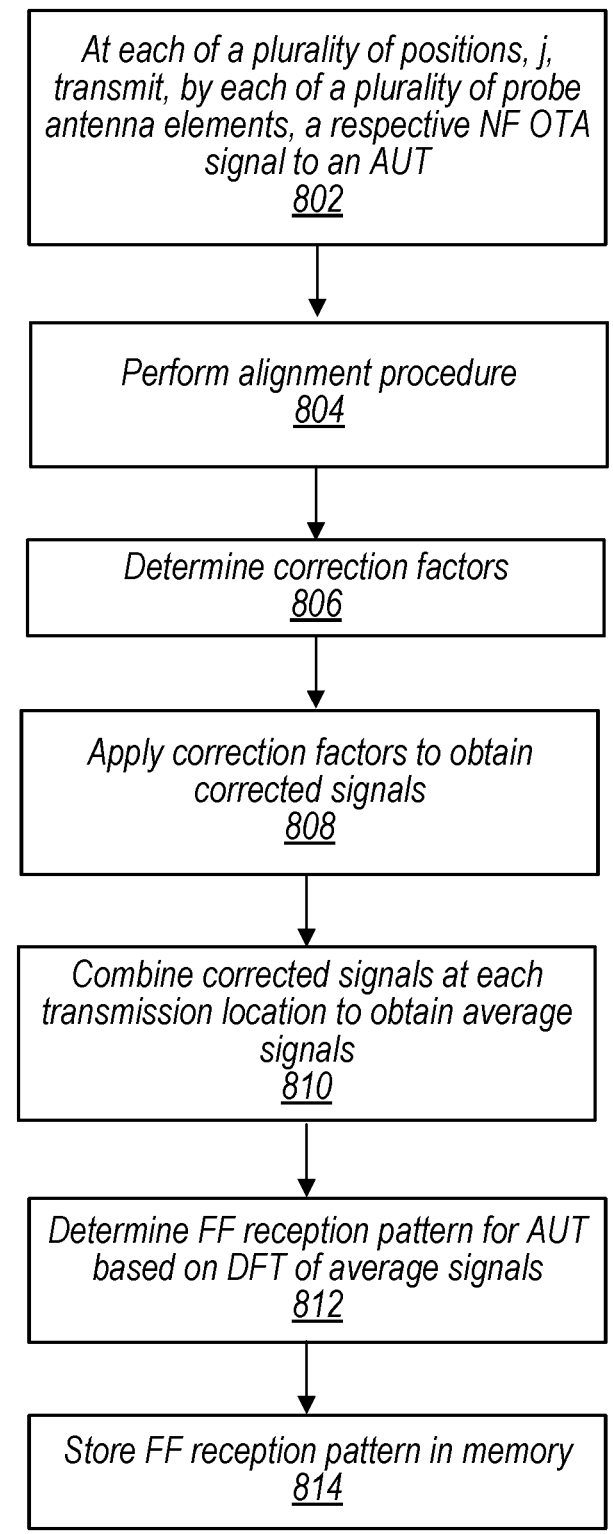
FIG. 8 is a flowchart diagram illustrating a method for using a multi-probe transmitter to characterize a far-field reception pattern of an AUT, according to some embodiments.

FIG. 8—Flowchart—Determination of FF Reception Pattern from Multi-Probe Scan FIG. 8 is a flowchart diagram illustrating a method for determining a FF reception pattern of an AUT by utilizing a multi-probe scan, according to some embodiments. The methods described in reference to FIG. 8 are similar in some aspects to those described in FIG. 7, with the difference that the methods of FIG. 8 characterize FF reception characteristics of the AUT (and the probe antennas transmit the NF OTA signals to the AUT), whereas the methods of FIG. 7 characterize FF transmission characteristics of the AUT (and the probe antennas receive the NF OTA signals from the AUT). In some embodiments, a PAS is utilized with both transmission and reception capabilities, such that a single system is configured to perform both the methods of FIGS. 7 and 8. Alternatively, the system may include a dedicated receiver or transmitter PAS.

The method shown in FIG. 8 may be used in conjunction with any of the computer systems, memory media or devices shown in the above Figures, among other devices. For example, a processor of a computer system 82 may execute program instructions stored in memory to direct the AUT, the measurement apparatus 84, and/or the multi-probe receiver to perform the described methods steps. The processor may further perform calculations based on signals received from the AUT and/or the measurement apparatus. In various embodiments, some of the method elements shown may be performed concurrently, in a different order than shown, or may be omitted. Additional method elements may also be performed as desired. As shown, this method may operate as follows.

At 802, at each respective position, j, of a plurality of positions within a scan area, each probe antenna element of a plurality of probe antenna elements of a transmitter (also called a probe transmitter) transmits a respective near-field (NF) over-the-air (OTA) signal to the AUT, which is received by the AUT as an electric field vector, $\vec{E}(i, j)$, where i denotes the respective probe antenna element of the receiver and j denotes the respective position. The NF OTA signals may be transmitted sequentially by each probe antenna element at each position, to avoid interference between signals by different probe antenna elements and to track which signal is received by which probe antenna element.

In various embodiments, the AUT and/or the probe transmitter may be sequentially moved to each of the plurality of positions. For example, the probe transmitter may be moved to each position within the scan area while the AUT remains fixed, or the AUT may be moved to each position while the probe transmitter remains fixed. Alternatively, both the AUT and the probe transmitter may be moved. Note that "position" refers to the relative position of the AUT and a reference point on the probe transmitter. The plurality of positions is selected to cover a desired scan map for the AUT, where the scan map may be rectilinear, spherical, cylindrical, or more generally of any desired shape.

As one example, when both the AUT and the probe transmitter are moved, the AUT may be moved along the x-direction and the probe transmitter may be moved along the y-direction, or one device may be moved in the horizontal plane while the other is moved vertically. Other combinations are also possible. As illustrated in FIG. 14, the position may be identified as an arbitrary position on the probe (the probe head, as illustrated), as distinguished from probing locations, which refer to the location of a particular antenna of the probe transmitter within the array.

The transmitter may include an array of a plurality of probe antenna elements. In some embodiments, the transmitter is a probe antenna system (PAS), or it may be another type of transmitter that includes a plurality of antenna probes.

The two polarizations of the electric field may be transmitted sequentially or in parallel, in various embodiments. To avoid confusion, note that "position" refers to the location in space of the transmitter relative to the AUT, whereas "transmission location" refers to the precise location of each probe antenna element of the transmitter relative to the AUT when it transmits a NF OTA signal to the AUT.

For each probe antenna element, the transmitted NF OTA signals may be used to construct a scan map for the respective probe antenna element, which is a map of the transmitted signals at each transmission location where the respective probe antenna element transmitted a signal.

At 804, an alignment procedure is performed to spatially align the transmission locations for signals transmitted by different ones of the plurality of probe antenna elements. In some embodiments, the alignment procedure may be performed based on precise construction specifications of the transmitter. For example, the transmitter may have been constructed to precisely defined specifications that are provided in a spec sheet, such that the user has sufficiently precise knowledge (i.e., sufficiently precise to obtain a desired precision for the FF transmission pattern determination) of the relative positions of each of the probe antenna elements of the array. In these embodiments, the alignment procedure may simply align the transmission locations of signals received throughout the scan procedure by the AUT based on the known positions in the array of the probe antenna elements relative to each other. Accordingly, alignment will identify two (or more) signals transmitted by two (or more) respective probe antenna elements from the same physical point in space (relative to the AUT) as being transmitted from the same transmission location, such that these two (or more) signals may be subsequently combined (along with any other signals that may have been transmitted from that transmission location). Note that, in the case where the distance between subsequent positions of the transmitter during the scan and the distance between adjacent transmission locations of the probe antenna elements are non-commensurate, transmission locations may be identified as coinciding if they are within a predetermined threshold distance of one another.

In some embodiments, the transmitter may not be provided with sufficiently accurate construction specifications to facilitate alignment, and a manual alignment procedure may be performed. In these embodiments, performing the alignment procedure may include, at each of the plurality of positions within the scan area, transmitting, by each probe antenna element of the plurality of probe antenna elements, a respective NF OTA calibration signal to the AUT which is received as an electric field vector, $\vec{E}_c(i, j)$, wherein i denotes the respective probe antenna element of the transmitter and j denotes the respective position. The NF OTA calibration signal may be constructed to have one or more clearly identifiable spatial features within the scan area. For example, the NF OTA calibration signal may exhibit a peak amplitude at or near a central point of the scan area, and/or concentric roughly circular iso-phase curves with clearly defined centers.

The alignment procedure may proceed by identifying one or more of these features for the scan map measured by a calibration antenna as a "reference transmission location," which is a particular transmission location that is used as a reference point for performing alignment. For example, the reference transmission location may be identified as the transmission location where the AUT received a largest amplitude reference calibration signal from the calibration antenna, or as the center of concentric iso-phase curves in the phase scan map of signals received from the reference probe antenna. In some embodiments, two reference transmission locations may be determined based on both the largest amplitude signal and the center of the iso-phase curves, and these locations may be averaged to obtain an average reference transmission location to use for alignment (and potentially also for determining the correction factors, as described below).

In some embodiments, the NF OTA calibration signal may include multiple identifiable features (e.g., multiple amplitude peaks within the scan area), and multiple respective reference transmission locations may be determined. The alignment procedure may then be performed separately for each reference transmission location, and the results may be averaged to obtain the overall alignment. In some embodiments, the average of the separate alignment procedures may be weighted based on signal-to-noise ratios (SNRs) of signals transmitted at the different reference transmission locations.

Respective transmission locations may then be identified where the same feature(s) are identified for the scan maps of the other probe antenna elements as for the reference antenna element. The transmission locations may then be aligned for each respective probe second antenna element based on differences between the reference transmission location and the respective second transmission locations. Accordingly, the scan maps of each probe antenna element may be aligned such that signals transmitted at the same transmission location by different probes may be identified for subsequent combination at step 810.

At 806, a plurality of respective correction factors is determined that characterize amplitude and phase discrepancies between a reference probe antenna element of the plurality of probe antenna elements and respective second probe antenna elements of the plurality of probe antenna elements. The correction factors may be complex valued and may encode both amplitude and phase discrepancies in the signals transmitted by the second probe antenna elements relative to those transmitted at the same transmission location by the reference probe antenna element.

In some embodiments, determining the plurality of respective correction factors includes identifying a reference signal transmitted by the reference probe antenna element at a reference transmission location, identifying respective second signals transmitted by the second probe antenna elements at the reference transmission location, and determining the respective correction factors based at least in part on respective differences between a reference amplitude and phase of the reference signal and respective amplitudes and phases of the respective second signals. Accordingly, each second probe antenna element may have a respective correction factor determined for it that characterizes the differences in amplitude and phase of signals transmitted by the second probe antenna element and those transmitted by the reference probe antenna element at the same reference transmission location. The reference transmission location used for determining the correction factors may generally be the same as or different from the reference transmission location(s) used to perform the alignment procedure, in various embodiments.

In some embodiments, identifying the reference signal (and thereby also the reference transmission location) includes identifying that the reference signal has a highest signal-to-noise ratio of all signals received by the AUT from the reference probe antenna. In some embodiments, the reference signal may be the same signal used to perform the alignment procedure, or it may be a separate reference signal transmitted at a different reference transmission location.

In some embodiments, rather than determining the correction factors based on an individual reference signal transmitted by the reference probe antenna element and individual signals transmitted by the second probe antenna elements at the reference transmission location, the amplitude and phase may be averaged over a small region surrounding the reference transmission location for both the reference probe antenna element and the second probe antenna elements. For example, a reference average may be determined of the reference amplitude and phase and a first plurality of amplitudes and phases of signals transmitted by the reference probe antenna element in a first region surrounding the reference transmission location. In addition, for each of the second probe antenna elements, a respective second average may be determined of the respective amplitude and phase of the respective second signal and a respective second plurality of amplitudes and phases of signals transmitted by the respective second probe antenna element in the first region. The respective correction factors may then be determined based on respective differences between the reference average and the respective second averages. Advantageously, correction factors determined based on this averaging procedure may be less sensitive to noise or aberrant signal error.

At 808, respective correction factors are applied to NF OTA signals received by the AUT from the respective second probe antenna elements to obtain corrected signals. The corrected signals are corrected to have the same amplitude response and to be in-phase with signals received from the reference probe antenna element from the same transmission location. For example, differences in probe response, cabling, and other hardware discrepancies may cause amplitude and phase-response differences between the probe antenna elements. The phase correction enables the signals transmitted from each transmission location to be combined coherently without introducing destructive interference. The correction factors correct for deviations in amplitude response and phase between different probe antenna elements, relative to the reference probe antenna element.

At 810, for each respective transmission location within the scan area, the corrected signals received from the respective transmission location are combined to obtain a respective average signal. Towards the center of the scan area, a larger number of corrected signals will typically be combined (e.g., since a larger number of probe antenna elements generally traverse the center of the scan area), whereas the outer region of the scan area will often have a smaller number of corrected signals to combine (potentially just one at the edge of the scan area). For each transmission location, all of the corrected signals received from that transmission location (or within a predetermined threshold distance of the transmission location, e.g., half of the distance between adjacent positions of the transmitter) may be combined through an averaging procedure. In some embodiments, the averaging procedure is weighted based on a SNR or another quality metric of the corrected signals, such that higher SNR signals are granted a larger weight in the averaging procedure. The result of the averaging process may be an average corrected signal for each transmission location.

In some embodiments, probe compensation is performed for each probe antenna element to correct for discrepancies in reception sensitivity of the AUT from each probe antenna element when transmitting at different transmission locations. For example, different transmission locations may be at different distances from the AUT and/or oriented at different angles relative to the AUT such that the sensitivity of the AUT varies between different transmission locations. To perform probe compensation, at each respective position, j, of the plurality of positions, each respective probe antenna element may transmit a respective OTA calibration signal to a calibration antenna, which is received as an electric field vector. $\vec{E}_c(i, j)$, where i denotes the respective probe antenna elements and j denotes the respective position.

Probe compensation may be performed by, for each respective probe antenna element, correcting for amplitude and phase discrepancies for signals transmitted by the respective probe antenna element at different transmission locations relative to the known spatial profile of the calibration signal.

In some embodiments, probe compensation is performed by determining a modal probe compensation spectrum based on the average signals. This may include determining a first modal representation of a spatial map of the respective average signals and determining a second modal representation of a spatial map of a plurality of calibration signals, where the second modal representation reflects an undistorted reception pattern for the AUT (e.g., the second modal representation may be obtained directly via far-field measurements). The modal probe compensation spectrum may be determined from the difference between the first and second modal representations. The modal probe compensation spectrum may be applied to the average signals to obtain probe-compensated average signals, and the FF reception pattern for the AUT may be determined by performing a discrete Fourier transform on the probe-compensated average signals. The probe antenna elements may have different sensitivities to different spatial modes, and the probe compensation may correct for these discrepancies.

At 812, a far-field (FF) reception pattern is determined for the AUT based at least in part on a discrete Fourier transform (DFT) of the respective average signals. In some embodiments, the DFT may be performed on the probe-compensated average signals. For example, Equations 1-7 above and the associated description describe how a NF-to-FF transform may be used to characterize the FF reception pattern based on the NF corrected and averaged signals. The average signals may provide a more accurate and precise map of the NF electric field reception pattern of the AUT than would be obtained from a single probe scan, or from a stationary multi-probe measurement, which may enable a more accurate determination of the FF reception pattern at lower cost and without the expense of utilizing a large (e.g., size of the FF distance) anechoic chamber.

At 814, the FF reception pattern is stored in a non-transitory computer readable memory medium. The FF reception pattern may be useable for quality control during an AUT manufacturing process, to characterize specifications of a manufactured AUT, and/or for other AUT characterization purposes, as desired.

Additional Technical Description

The following numbered paragraphs describe technical aspects of the described embodiments in further detail.

An example of a probe array ("active PAS") is shown in FIGS. 9A-C. As illustrated, the probe array includes 16 probe antennas in a 4×4 configuration. The illustrated probes are single-polarized Vivaldi-type antennas designed for measurement frequencies around 30 GHz. The probe array also includes 16 frequency up- and down-converters, one for each probe antenna, to translate between the radiation frequency (around 30 GHz) and the instrument operating frequency range below 6 GHz. The local oscillator signals for the conversion may be shared among the probes and with the measurement sub-system. As illustrated, FIG. 9A shows an example circuit layout for a single printed circuit board (PCB), FIG. 9B shows a combination of four stacked PCBs where adjacent PCBs are rotated 180° relative to each other, and FIG. 9C illustrates an antenna socket. Advantageously, the mirrored design of the stacked PCB configuration may improve isolation of the probe antennas The probe array may be positioned on the scan plane above the AUT and parallel to the AUT's aperture plane. For measurements of the cross-polarization field components, the probe array may be rotated by 90 degrees within the scan plane. In these embodiments, a subset of four probe antennas, e.g., in a 2×2 configuration, may be connected simultaneously to the four available instrumentation channels.

The positioning subsystem may change the x, y, and z positions between probe array and AUT and may include three precision linear axes of which one changes the z position by moving the probe array relative to the AUT, and the other two change the x and y positions, respectively, by moving the AUT relative to the probe array. The positioning subsystem may also include a dedicated controller to control the precision axes and interface with the measurement subsystem's controller; static fixturing for the precision axes, the probe array and the AUT; and absorber material to limit reflections from exposed mechanical parts of the device.

Some embodiments utilize a reference antenna with a broad, close to omnidirectional radiation pattern. In these embodiments, the reference antenna may be a single patch antenna. An example radiation pattern for such an omnidirectional antenna is shown in FIG. 10. More broadly, embodiments herein may be used with any multi-probe single- or dual-polarized measurement device, any radiating AUT, and at different frequencies.

Scanning the NF with Multiple Probes

In some embodiments, a NF scanner may take NF samples of the AUT over the entire scan surface area, where samples are spaced apart according to the desired NF spatial resolution. This may be implemented in different ways including the ones described below and combinations thereof.

If the size of the probe array is smaller than the scan surface area, the array may be moved across the surface. One possibility is to move the array to a first location, take measurement readings (or generate radiation) at that location for each probe antenna, then continue to the next location where again measurements are taken on (or radiation is generated from) all probe antennas, and so forth. This may be orchestrated in a way that the sampled areas corresponding to the first location and all subsequent locations do not overlap. Alternatively, these sampled areas may intentionally overlap, e.g., to provide additional averaging gain.

The movement of the probe array across the scan surface may proceed in a manner where it moves to a position, stops to take the measurements or radiate at that position, and resumes movement to the next location, in some embodiments. Alternatively, a more continuous movement may be used with measurements taken or radiation generated while moving, potentially combined with a device to track the exact location at the time of taking an individual measurement.

In some embodiments, the probe array may be made large enough to cover the entire scan area, and the spacing of its elements small enough to meet the spatial sampling requirements. In this case, the NF scanning may be performed without any probe and/or AUT movement, which may be the fastest way to scan. In some embodiments, the array may be moved slightly to increase the spatial sampling density once all measurements are combined.

Irrespective of how the probe array is positioned to cover the entire scan surface, measurements on the multitude of probe antennas may be performed fully parallel, i.e., simultaneously. Alternatively, in some embodiments, measurements are taken from one probe antenna at a time and cycled through the plurality of probes. One may also consider going through a subset of probe antennas only, e.g., for some locations of the array where some probes would be blocked from the radiation field to be measured, or for some other reason of optimization.

Various other schemes may be devised and implemented in different ways as long as a relationship between the amplitude and phase measurements and the spatial point they can be attributed to may be established from the data collected. The procedure for taking measurements may depend on the capabilities of the measurement instrumentation which may, e.g., provide enough parallel receivers or generators to measure or generate from all probes simultaneously. In some embodiments, multiple probes may be operated concurrently at different frequencies, where the different frequency signals may be disambiguated via post-processing by the receiver. For example, when the PAS is transmitting to the AUT to characterize FF reception properties of the AUT, transmitting at a distinct frequency by different probe antenna elements may enable concurrent transmissions by these probes to be distinguished based on frequency, significantly speeding up the AUT characterization procedure. It may be possible to control the amplitude scaling and phase offset individually per probe or for different groups of probes in the array; and this may affect how often and with what variation of probe amplitude and phase settings samples are taken at a given location of the scan surface.

Whatever the scheme to cover the scan surface, methods described herein enable a coherent combination and processing of the data from multiple probes effectively.

Coherent Combination of Probes

Each probe of the probe array may sample the radiated field of the AUT individually. Embodiments herein utilize these parallel samples of the field by coherent combined processing. However, the probes and different channels of the measurement system may have variations in their gains and phase offsets, translating to similar variations in the sampled fields. Processing them in some combined form, may, in general, lead to inaccurate results because, e.g., phase offsets close to 180 degrees will lead to the "cancellation" of signal energy.

To address these and other concerns, embodiments herein adjust the amplitude and phase of the captured field for each probe before combining them. Also, the exact spatial offset of each probe to the other probes may be determined such that the data may be aligned along their (x,y) coordinates.

Amplitude and phase calibration and spatial alignment may be achieved by utilizing measurements on a calibration antenna. A calibration antenna may be selected that has no "zeros" in its pattern, i.e., an antenna that is free of regions where the radiated power is low and spatial discontinuities in the phase may be observed. Presence of such zeros may at least locally limit the effectiveness and accuracy of the described methods, due to excessive local noise. Any antenna that is free of zeros within the covered scan surface may be suitable to function as a calibration antenna. The calibration antenna may be a dedicated reference antenna, to be used specifically for calibration and alignment, or it may be an AUT to be characterized. In some embodiments, the calibration antenna is single-polarized, as this may enable characterization of cross-polarization discrimination more accurately.

The calibration antenna is measured with all probe antennas of the receiver, scanned over the scan area. In this process the radiation pattern from the AUT may be steady and unchanging until all measurements are done. The result is one set of two-dimensional near-field amplitude and phase data for each probe antenna. As used herein, each set is also referred to as a "scan", a "scan area", or a "scan map"

A location of a specific feature of the radiation pattern may be identified in each scan to facilitate spatially aligning all scans, and the variation of amplitude and phase values for that feature may be evaluated across all scans to compute "adjusted scans" by adjusting their amplitudes and phases for coherent combining. Finally, the spatially aligned and amplitude and phase calibrated scans may be combined.

This procedure may be considered a calibration of measurements with the multi-probe NF scanner. It may be performed once before a series of measurements on arbitrary AUTs, or before each AUT measurement scan (e.g., if the no-zeros condition on the transmission pattern is met).

Spatially Aligning the NF Scans

In some embodiments, the location of a particular spatially well-defined and well-confined point or feature of the calibration antenna pattern may be identified in each of the scans from each of the probes. As all probes scanned the same field of the AUT, this identifies the location of the same physical point or feature relative to the coordinates of each scan. Once the relative location of that particular point or feature is known for each scan, all points across all scans may be spatially aligned.

Because the scan area is finite, after spatial alignment the scans will overlap only partially. Typically, the center area may be covered by all scans and the outer regions may be covered by a smaller number of scans. Some regions, e.g., near the corners of the combined scan area, may be covered by a single scan only.

The combined scan area is typically larger than the area covered by any single probe, so a given area may be scanned faster (i.e., with fewer measurements for a given spatial density of measurement points) with a multi-probe scanner compared to a single-probe scanner. Conversely, for the same scan time, a multi-probe system may achieve a higher resolution of the FF result by increasing the scanned area and/or decreasing the distance between adjacent measurement locations.

The point to locate in all scans may be, e.g., the phase center of the measured radiation. Other choices include the amplitude peak, or any other point or feature that corresponds to the same physical point or feature of the AUT pattern that is completely present in all scans and whose location is uniquely determined in all scans. For example, a scan point of a reference antenna with the largest amplitude of all scan points within the scan area may be used as a reference point. Alternatively or additionally, the center of a concentric structure of roughly circular iso-phase curves in the phase plot may be used to identify the reference point.

For an AUT, e.g., an array antenna, that has in its radiation pattern multiple easily identifiable features, e.g., multiple phase centers or amplitude peaks, one may determine a possibly weighted average or interpolated location as long as the same averaging or interpolation operation is performed for each scan. The average may be weighted based on the signal-to-noise ratio at each of the reference locations, in some embodiments.

Correcting Amplitudes and Phases and Combining Scans

After spatially aligning the scans for each of the probe antennas, the differences in amplitude and phase relative to the same reference probe antenna may be determined for each scan. To this end, this may be determined for the previously determined location of the particular point or feature of the AUT pattern, or another point or region in the pattern, as long as the chosen point or region corresponds to the same physical point or feature of the AUT pattern is completely present in all scans and its location is uniquely determined in all scans.

Once the relative amplitudes and phases are determined for the reference point or feature in each scan, the amplitudes and phases of all points in all scans may be made coherent by the application of complex valued correction factors, and then combined.

Because the adjusted scans may spatially overlap only partially, combining the scans may not be done equally on all points. For the outer regions of the combined scan area, a somewhat reduced combining gain may be expected. This may be negligible, e.g., for higher-gain antennas such as phased arrays for which the biggest proportion of radiated power is confined within the center region of the combined scan area where all adjusted scans overlap.

One option for the point or feature on which to evaluate differences in amplitude and phase may be the point determined during spatial alignment, which may be the phase center or the amplitude peak of the AUT pattern. The amplitude and phase reference may be the value for the chosen point for one specific scan, e.g., the first scan. It may also be selected differently as long as the same reference is used for all scans.

If amplitude and phase differences are evaluated on more than a single point per scan, e.g., on all the points in a confined small region, the amplitude and phase values associated with the scan may be obtained from interpolation or by averaging over the amplitudes and phases of these points. This may result in higher accuracy especially if the NF scan data contains significant levels of noise or other random effects.

In some embodiments, the adjusted scans are combined by averaging them point-by-point. This will increase the signal-to-noise ratio for each point contained in multiple scans. One may also choose to perform a weighted average, e.g., to emphasize scans with higher signal-to-noise ratio levels, or forms of maximum-ratio combining, or other such operations. For example, this may be desirable when additional complementary information on the reliability of the scan data is available. The combining may be applied similarly to all points contained in multiple scans or differently to different groups of points, e.g., to facilitate additional modal filtering to analytically suppress the detrimental impact of reflections in the measurement setup on the measurement result.

In some embodiments, when the spatial offset between the adjusted scans is such that the locations of the adjusted sample points do not align exactly, the adjusted scan data may first be interpolated to an aligned grid of interpolation points on which the combination is performed. This situation may arise, e.g., when the spatial offset is not an integer multiple of the sample distance.

Additionally, the combined scan data may be smoothed or filtered, in some embodiments, e.g., to mitigate any slight discontinuities or other edge effects from combining the multiple scans. For example, this may happen at points in the scan surface where the set of adjusted scans that are available for combination changes.

Probe Compensation for an Array of Probes

Some embodiments proposed herein identify and correct for the interactions between array elements, to result in a correction pattern applicable to all subsequent AUT measurements with the multi-probe NF scanner as long as the environmental conditions (e.g., temperature) determining the radiated and conducted properties of the probing system stay constant or at least within limited bounds as deemed acceptable for the particular application.

In some embodiments, the combined field is transformed into the modal domain. This raw modal spectrum is related to another modal reference representation of the same calibration antenna which is known to be accurate. This operation results in correction factors, relative to the reference modal representation, for each modal component. In each subsequent measurement, irrespective of the AUT, the modal correction factors may be applied to the raw modal spectrum, thus compensating for the multi-probe effect.

In some embodiments, the reference modal representation may be obtained from measuring the calibration antenna, e.g., in a large anechoic chamber using an accurate FF scanner or through other means. The result of this measurement may be directly the reference modal representation, or alternatively it may be obtained from a transformation of the measurement.

Mathematically, the modal compensation spectrum for each modal component $(k_x, k_y)$ may be expressed as:

$$f_{x,cor}(k_x, k_y) = \frac{f_{x,FF,n}(k_x, k_y)}{f_{x,NF,n}(k_x, k_y)} \qquad (7)$$

where the raw modal spectrum is denoted as $f_{x,NF}(k_x, k_y)$ and the reference modal representation is $f_{x,FF}(k_x, k_y)$. The reference modal representation may be determined using a calibrated scanner. The raw and reference modal representations of the pattern may be normalized (indicated by a subscript n) to eliminate the system gains of the measurement setups. In subsequent measurements, these correction factors $f_{x,cor}(k_x, k_y)$ may then be multiplied with the raw modal spectrum obtained from the multi-probe NF measurement data for an arbitrary AUT, $f_x(k_x, k_y)$, to realize multi-probe compensation.

$$f_{x,comp}(k_x, k_y) = f_x(k_x, k_y) * f_{x,cor}(k_x, k_y) \qquad (8)$$

The compensated modal spectrum $f_{x,comp}(k_x, k_y)$ is then the input for the NF-to-FF transformation.

Equations 7 and 8 reflect the operation for the "x" polarization. Processing may be done analogously for the "y" polarization. A single-polarized reference antenna may be rotated by 90 degrees to accurately capture the "y" polarization for coherent combining and probe compensation.

Figure 11:
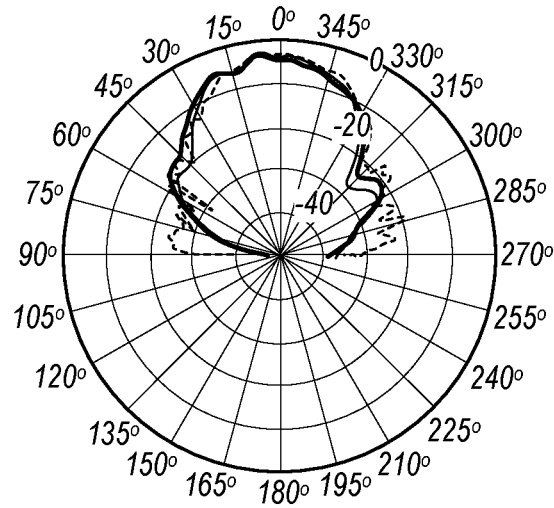
FIG. 11 illustrates measurement results with and without probe correction, according to some embodiments.
Figure 11:
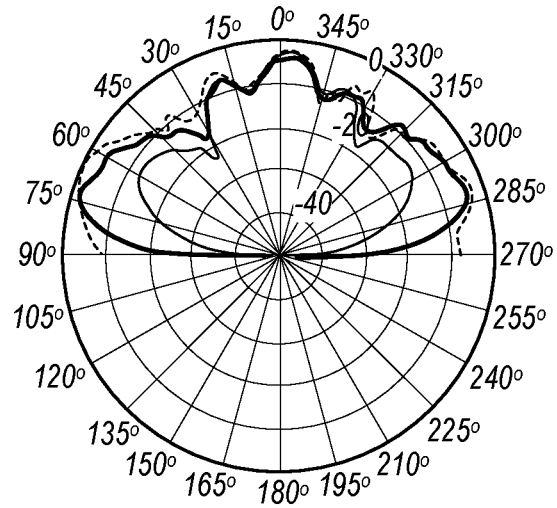
Figure 11:
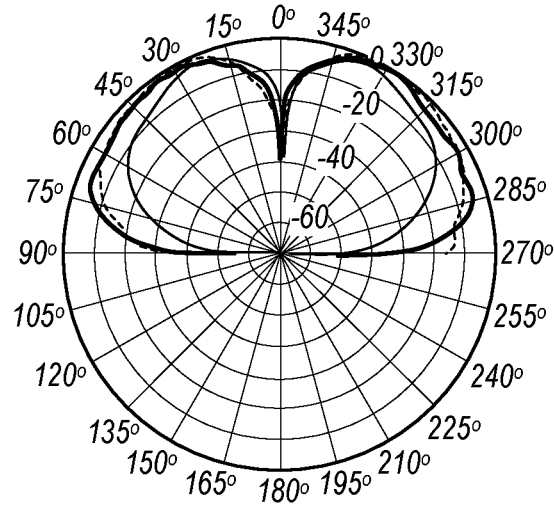
Figure 11:
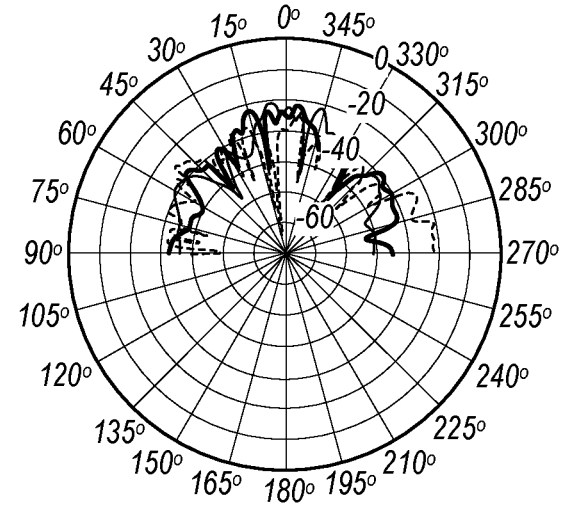
Figure 13:
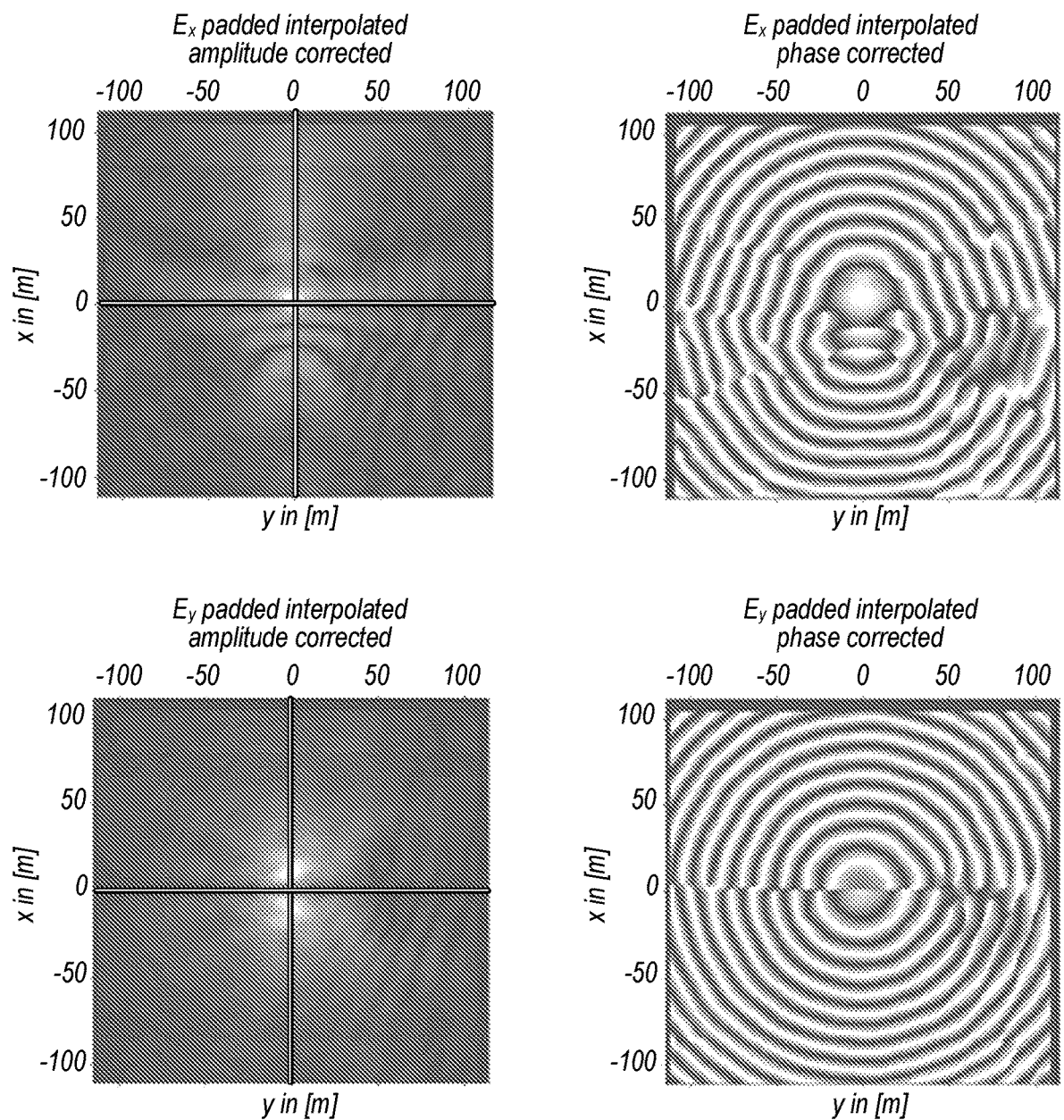
FIG. 13 illustrates amplitude and phase-corrected signal maps, according to some embodiments.

FIGS. 11-13 illustrate the effectiveness of the described methods in measurements of a test AUT with a multi-probe NF scanner. The test AUT is a patch antenna with intentional design anomalies to make its radiation pattern show easily recognizable features such as deep "zeros" and additional lobes. Such features may help in verifying the method. Some embodiments may skip using a test AUT and this verification step. In the illustrated examples, the test AUT was measured by each of the four corner elements of the selected multi-probe array. The four corresponding NF scans were coherently combined by first detecting and aligning the phase center in each scan, followed by adjusting for the estimated differences in the amplitudes and phases across these scans. The estimation of these differences was performed by averaging over a set of points within a circle with a radius of six points around the phase center location.

FIG. 11 illustrates the FF patterns of the test AUT for both polarizations and in the two principal cut planes. The patterns shown are from the reference measurement and system and as determined from the multi-probe NF scans using a NF-to-FF transform both, with and without, the multi-probe correction. The untruncated angle is $\theta_y=75$ degrees for the used setup, i.e., results may be expected accurate within ±75 degrees.

As evident from comparing the illustrated patterns in FIG. 11, with coherent combining and compensation of probe effects there is a very good match with the reference FF patterns even for the low-power cross-polarization plane. The FF pattern is not only reconstructed accurately by the multi-probe NF scanner in the high-power region, but it also accurately tracks the presence and location of pattern nulls.

FIGS. 12A-B illustrates the captured planar NF in amplitude and phase for each probe, in one embodiment. Each probe is spatially shifted and has an amplitude and phase offset. FIG. 13 illustrates the coherently combined planar NF computed from these four captured scans, in one embodiment.

Operation for Multiple Frequencies and Wideband Signals

In some embodiments, the systems and methods are described for a single-frequency operation. However, in some embodiments they may be performed for all frequencies of interest. For wideband measurements for example, all captured signals may be transformed into a frequency domain representation, the processing for coherent combining may be applied, probe compensation and subsequent NF-to-FF transformation may be performed in the frequency domain, and the resulting FF frequency-domain data may be transformed back into a time-domain representation for further use. Other orders of processing steps may be adopted, as desired.

PAS Design

Different embodiments may use various antenna structures in the PAS to improve performance against the design criteria. Such antenna structures include, e.g.:

1. Yagi antennas may help with high directivity towards the opposite AUT antenna element but the metallic directors may increase coupling between the adjacent probe antennas and may add reactive near field disturbance;

2. Antipodal Vivaldi antennas may ease broadband operation with good matching over a large range of frequencies, may reduce adjacent coupling but with large aperture may increase the potential for reflections;

3. Horn antennas may be favored because of very good coupling between AUT antenna element and PAS element and excellent isolation especially with dielectric filling but such filling may create strong reflections off of the PAS element and, thus, unduly alter the AUT impedance.

The PAS antenna elements and the array may be implemented in several ways. In some embodiments, the PAS array may be built from individual antenna elements. In other embodiments, a plurality of probe antenna elements may be realized as a single module. In one particular embodiment, illustrated in FIGS. 9A-C, four elements are arranged together on a single multi-layer printed circuit board and the entire array is built from four such modules.

In some embodiments, the PAS comprises antipodal antennas with integrated balun. The antipodal antenna structure may be largely or mostly symmetrical but the balun structure may introduce a slight asymmetry. This may lead to a non-uniform coupling of the unwanted AUT-PAS paths. This non-uniform coupling does not significantly affect operation. In some embodiments the PAS design includes a periodical mirrored arrangement of the antenna which may resolve this issue.

The design of the absorbing structure between the PAS antennas may incorporate an absorbing material that implements a trade-off between inter-PAS-element isolation and (dielectric) loading of the AUT antennas. Too little absorbing material may lead to insufficient isolation between the PAS antenna elements. Too much absorbing material changes the impedance of the AUT antenna above the given limit. The shape of the absorbing material is important as well as the volume. To achieve good absorption behavior and thus minimize the reflected energy, the PAS design may include a large surface with less parallel and/or 90° corners with respect to the direction of the energy flux of the electromagnetic radiation.

In one embodiment, the PAS antennas could be cast directly into the absorbing structure. Direct casting of the antennas into the absorbing structure may simplify the manufacturing. However direct contact of the absorbing material with the RF transmission lines connecting the PAS antenna elements may increase losses on these transmission lines, especially with microstrip transmission lines.

If this is undesirable, another embodiment may leave some small absorber-free region in the absorber structure around and close to the RF transmission lines.

Still other embodiments may optimize RF transmission line losses in various other ways. One example may be to use strip-line transmission lines, which may prevent the electromagnetic field from penetrating the absorbing material.

Although the embodiments above have been described in considerable detail, numerous variations and modifications will become apparent to those skilled in the art once the above disclosure is fully appreciated. It is intended that the following claims be interpreted to embrace all such variations and modifications.

The invention claimed is:

1. A method for testing an antenna-under-test (AUT), the method comprising:
at each respective position, j, of a plurality of positions of a scan area:
transmitting a respective near-field (NF) over-the-air (OTA) signal to the AUT by respective probe antenna elements of a plurality of probe antenna elements of a transmitter, wherein the respective NF OTA signals are transmitted sequentially by the respective probe antenna elements, wherein the NF OTA signals are received by the AUT as respective electric field vectors, $\vec{E}(i, j)$, wherein i denotes the respective probe antenna element and j denotes the respective position;
performing an alignment procedure to align transmission locations for NF OTA signals received from different ones of the plurality of probe antenna elements;
determining a plurality of respective correction factors that characterize amplitude and phase discrepancies between a first reference probe antenna element of the plurality of probe antenna elements and respective second probe antenna elements of the plurality of probe antenna elements;
applying the plurality of respective correction factors to the NF OTA signals received by the AUT to obtain respective corrected signals;
for each respective transmission location within the scan area, combining the corrected signals transmitted from the respective transmission location to obtain a respective average signal;
determining a far-field (FF) reception pattern for the AUT based at least in part on a discrete Fourier transform of the respective average signals; and
storing the FF reception pattern in a non-transitory computer readable memory medium.

2. The method of claim 1,
wherein performing the alignment procedure comprises:
at each respective position, j, of the plurality of positions:
transmitting, by each respective probe antenna element of the plurality of probe antenna elements to the AUT, a respective NF OTA calibration signal that is received by the AUT as an electric field vector, $\vec{E}_c(i, j)$, wherein i denotes the respective probe antenna element and j denotes the respective position;
identifying a reference transmission location where the AUT received a first calibration signal from a reference probe antenna element;
identifying respective second transmission locations where the AUT received respective second calibration signals from respective second probe antenna elements that correspond to the first calibration signal; and
aligning the transmission locations based on differences between the reference transmission location and the respective second transmission locations.

3. The method of claim 2,
wherein the first and second calibration signals comprise:
largest amplitude NF OTA calibration signals received by the AUT from the reference probe antenna element and the second probe antenna elements, respectively; or centers of concentric iso-phase curves within the scan area for scan maps of the reference probe antenna element and the second probe antenna elements, respectively.

4. The method of claim 1,
wherein determining the plurality of respective correction factors comprises:
  identifying a reference signal transmitted from the reference probe antenna element at a reference transmission location;
  identifying respective second signals transmitted from the second probe antenna elements at the reference transmission location; and
  determining the respective correction factors based at least in part on respective differences between a reference amplitude and phase of the reference signal and respective amplitudes and phases of the respective second signals.

5. The method of claim 4,
wherein identifying the reference signal comprises identifying an isophase center within the scan area.

6. The method of claim 4,
wherein determining the respective correction factors based at least in part on the respective differences between the reference amplitude and phase of the reference signal and respective amplitudes and phases of the respective second signals comprises:
  determining a reference average of the reference amplitude and phase and a first plurality of amplitudes and phases of NF OTA signals transmitted from the reference probe antenna element in a first region surrounding the reference transmission location;
  for each of the second probe antenna elements, determining a respective second average of the respective amplitude and phase of the respective second signal and a respective second plurality of amplitudes and phases of signals transmitted from the respective second probe antenna element in the first region; and
  determining the respective correction factors based on respective differences between the reference average and the respective second averages.

7. The method of claim 1,
wherein the receiver comprises a probe antenna system (PAS).

8. The method of claim 1,
wherein combining the corrected signals transmitted from the respective transmission locations to obtain the respective average signals comprises performing a weighted average of the corrected signals,
wherein the weighted average is weighted based at least in part on a signal-to-noise ratio of the corrected signals.

9. The method of claim 1, further comprising:
at each respective position, j, of the plurality of positions:
  transmitting, by each respective probe antenna element of the plurality of probe antenna elements, a respective OTA calibration signal to the AUT as an electric field vector, $\vec{E}_c(i, j)$, wherein i denotes the respective probe antenna elements and j denotes the respective position, wherein the respective OTA calibration signals comprise omnidirectional OTA signals;
performing probe compensation, wherein performing probe compensation comprises, for each respective probe antenna element of the plurality of probe antenna elements:
  correcting for amplitude and phase discrepancies for signals received by AUT from the respective probe antenna element at different transmission locations.

10. The method of claim 1, further comprising:
determining a modal probe compensation spectrum, comprising:
  determining a first modal representation of a spatial map of the respective average signals;
  determining a second modal representation of a spatial map of a plurality of calibration signals, wherein the second modal representation is obtained via far-field measurements; and
  determining the modal probe compensation spectrum based at least in part on a difference between the first and second modal representations; and
applying the modal probe compensation spectrum to the average signals to obtain probe-compensated average signals,
wherein determining the FF reception pattern for the AUT based at least in part on the average signals comprises performing a discrete Fourier transform on the probe-compensated average signals.

11. A system for testing an antenna-under-test (AUT), the system comprising:
  a non-transitory computer-readable memory medium;
  a processor coupled to the memory medium;
  a transmitter comprising an array of a plurality of probe antenna elements, wherein the system is configured to:
    at each respective position, j, of a plurality of positions within a scan area:
      transmit, by each respective probe antenna element of the plurality of probe antenna elements, a respective near-field (NF) over-the-air (OTA) signal to the AUT as an electric field vector, $\vec{E}(i, j)$, wherein i denotes the respective probe antenna element and j denotes the respective position;
    perform an alignment procedure to align transmission locations for signals transmitted from different ones of the plurality of probe antenna elements;
    determine a plurality of respective correction factors that characterize amplitude and phase discrepancies between a first reference probe antenna element of the plurality of probe antenna elements and respective second probe antenna elements of the plurality of probe antenna elements;
    apply the plurality of respective correction factors to the NF OTA signals received by AUT from the respective second probe antenna elements to obtain respective corrected signals;
    for each respective transmission location within the scan area, combine the corrected signals received at the respective transmission location to obtain a respective average signal;
    determine a far-field (FF) reception pattern for the AUT based at least in part on a discrete Fourier transform of the respective average signals; and
    store the FF reception pattern in the non-transitory computer readable memory medium.

12. The system of claim 11,
wherein, in performing the alignment procedure, the system is configured to:
  at each respective position, j, of the plurality of positions:
    transmit, by each respective probe antenna element of the plurality of probe antenna elements to the AUT, a respective NF OTA calibration signal that is received by the AUT as an electric field vector, $\vec{E}_c(i, j)$, wherein i denotes the respective probe antenna element and j denotes the respective position;

identify a reference transmission location where the reference probe antenna element transmitted a first calibration signal;

identify respective second transmission locations where respective second probe antenna elements transmitted respective second calibration signals that correspond to the first calibration signal; and align the transmission locations based on differences between the reference transmission location and the respective second transmission locations.

13. The system of claim 12,
wherein the first and second calibration signals comprise:
largest amplitude NF OTA calibration signals received by AUT from the reference probe antenna element and the second probe antenna elements, respectively; or
centers of concentric iso-phase curves within the scan area for scan maps of the reference probe antenna element and the second probe antenna elements, respectively.

14. The system of claim 11,
wherein in determining the plurality of respective correction factors, the system is configured to:
identify a reference signal transmitted from the reference probe antenna element at a reference transmission location;
identify respective second signals transmitted from the second probe antenna elements at the reference transmission location; and
determine the respective correction factors based at least in part on respective differences between a reference amplitude and phase of the reference signal and respective amplitudes and phases of the respective second signals.

15. The system of claim 14,
wherein in determining the respective correction factors based at least in part on the respective differences between the reference amplitude and phase of the reference signal and respective amplitudes and phases of the respective second signals, the system is configured to:
determine a reference average of the reference amplitude and phase and a first plurality of amplitudes and phases of NF OTA signals transmitted from the reference probe antenna element in a first region surrounding the reference reception location;
for each of the second probe antenna elements, determine a respective second average of the respective amplitude and phase of the respective second signal and a respective second plurality of amplitudes and phases of signals transmitted from the respective second probe antenna element in the first region; and
determine the respective correction factors based on respective differences between the reference average and the respective second averages.

16. A non-transitory computer-readable memory medium comprising program instructions for testing an antenna-under-test (AUT), wherein the program instructions are executable by a processor to cause a system to:
at each respective position, j, of a plurality of positions within a scan area:
transmit, by a respective probe antenna element of a plurality of probe antenna elements of a receiver, a respective near-field (NF) over-the-air (OTA) signal, wherein the respective NF OTA signals are transmitted sequentially by the respective probe antenna elements, wherein the NF OTA signals are received by the AUT as respective electric field vectors, $\vec{E}(i, j)$, wherein i denotes the respective probe antenna element and j denotes the respective position;
perform an alignment procedure to align transmission locations for signals transmitted from different ones of the plurality of probe antenna elements;
determine a plurality of respective correction factors that characterize amplitude and phase discrepancies between a first reference probe antenna element of the plurality of probe antenna elements and respective second probe antenna elements of the plurality of probe antenna elements;
apply the plurality of respective correction factors to the NF OTA signals received by the AUT to obtain respective corrected signals;
for each respective transmission location within the scan area, combine the corrected signals received at the respective transmission location to obtain a respective average signal;
determine a far-field (FF) reception pattern for the AUT based at least in part on a discrete Fourier transform of the respective average signals; and
store the FF reception pattern in the non-transitory computer readable memory medium.

17. The non-transitory computer-readable memory medium of claim 16,
wherein, in performing the alignment procedure, the program instructions are further executable to cause the system to:
at each respective position, j, of the plurality of positions:
transmit, by each respective probe antenna element of the plurality of probe antenna elements to the AUT, a respective NF OTA calibration signal that is received by the AUT as an electric field vector, $\vec{E}_c(i, j)$, wherein i denotes the respective probe antenna element and j denotes the respective position;
identify a reference transmission location where the reference probe antenna element received a first calibration signal;
identify respective second transmission locations where respective second probe antenna elements transmitted respective second calibration signals that correspond to the first calibration signal; and
align the transmission locations based on differences between the reference transmission location and the respective second transmission locations.

18. The non-transitory computer-readable memory medium of claim 17,
wherein the first and second calibration signals comprise:
largest amplitude NF OTA calibration signals received by the AUT from the reference probe antenna element and the second probe antenna elements, respectively; or
centers of concentric iso-phase curves within the scan area for scan maps of the reference probe antenna element and the second probe antenna elements, respectively.

19. The non-transitory computer-readable memory medium of claim 16,
- wherein in determining the plurality of respective correction factors, the program instructions are further executable to cause the system to:
  - identify a reference signal transmitted by the reference probe antenna element from a reference transmission location;
  - identify respective second signals transmitted by the second probe antenna elements from the reference transmission location; and
  - determine the respective correction factors based at least in part on respective differences between a reference amplitude and phase of the reference signal and respective amplitudes and phases of the respective second signals.

20. The non-transitory computer-readable memory medium of claim 19,
- wherein identifying the reference signal comprises identifying that the reference signal comprises a highest signal-to-noise ratio of all NF OTA signals received by the AUT from the reference antenna.

\* \* \* \* \*